United States Patent
Kambe et al.

(10) Patent No.: US 11,795,059 B2
(45) Date of Patent: Oct. 24, 2023

(54) BORON ATOMIC LAYER SHEET AND LAMINATED SHEET, METHOD FOR MANUFACTURING THE SAME, AND LIQUID CRYSTALS

(71) Applicant: TOKYO INSTITUTE OF TECHNOLOGY, Tokyo (JP)

(72) Inventors: Tetsuya Kambe, Tokyo (JP); Shotaro Imaoka, Tokyo (JP); Aiko Watanabe, Tokyo (JP); Kimihisa Yamamoto, Tokyo (JP)

(73) Assignee: Tokyo Institute of Technology, Tokyo (JP)

( * ) Notice: Subject to any disclaimer, the term of this patent is extended or adjusted under 35 U.S.C. 154(b) by 892 days.

(21) Appl. No.: 16/647,739

(22) PCT Filed: Jan. 31, 2019

(86) PCT No.: PCT/JP2019/003380
§ 371 (c)(1),
(2) Date: Mar. 16, 2020

(87) PCT Pub. No.: WO2019/155979
PCT Pub. Date: Aug. 15, 2019

(65) Prior Publication Data
US 2021/0363021 A1 Nov. 25, 2021

(30) Foreign Application Priority Data

Feb. 7, 2018 (JP) ................................ 2018-020443
Feb. 7, 2018 (JP) ................................ 2018-020447
Jan. 16, 2019 (JP) ................................ 2019-005297

(51) Int. Cl.
*C01B 35/00* (2006.01)
*C01B 35/10* (2006.01)
*C30B 29/16* (2006.01)
*C30B 29/68* (2006.01)
*B82Y 30/00* (2011.01)
*B82Y 40/00* (2011.01)
*C30B 7/14* (2006.01)

(52) U.S. Cl.
CPC .......... *C01B 35/1027* (2013.01); *C30B 29/16* (2013.01); *C30B 29/68* (2013.01); *B82Y 30/00* (2013.01); *B82Y 40/00* (2013.01); *C01P 2002/20* (2013.01); *C01P 2002/52* (2013.01); *C01P 2002/72* (2013.01); *C01P 2002/74* (2013.01); *C01P 2002/77* (2013.01); *C01P 2002/82* (2013.01); *C01P 2002/84* (2013.01); *C01P 2002/85* (2013.01); *C01P 2002/88* (2013.01); *C01P 2004/02* (2013.01); *C01P 2004/03* (2013.01); *C01P 2004/04* (2013.01); *C30B 7/14* (2013.01)

(58) Field of Classification Search
CPC ..... C01B 35/1027; C30B 29/16; C30B 29/68; C30B 7/14; B82Y 30/00; B82Y 40/00; C01P 2002/20; C01P 2002/52; C01P 2002/72; C01P 2002/74; C01P 2002/77; C01P 2002/82; C01P 2002/84; C01P 2002/85; C01P 2002/88; C01P 2004/02; C01P 2004/03; C01P 2004/04
USPC ........................................................ 423/279
See application file for complete search history.

(56) References Cited

FOREIGN PATENT DOCUMENTS

WO 2018/011651 1/2018

OTHER PUBLICATIONS

Extended European Search Report dated Oct. 30, 2020 in corresponding European Patent Application No. 19750494.7.
Office Action dated Sep. 27, 2022 in Chinese Patent Application No. 201980005333.4, with English-language translation.
International Search Report dated May 7, 2019 in International (PCT) Application No. PCT/JP2019/003380.
Zhang et al., "Two-Dimensional Stoichiometric Boron Oxides as a Versatile Platform for Electronic Structure Engineering", Journal of Physical Chemistry Letters, 2017, vol. 8, No. 18, pp. 4347-4353.
Luo et al., "The adsorption and dissociation of oxygen on Ag (111) supported $\chi_3$ borophene", Physica B: Condensed Matter, vol. 537, 2018, pp. 1-6.

*Primary Examiner* — Steven J Bos
(74) *Attorney, Agent, or Firm* — Wenderoth, Lind & Ponack, L.L.P.

(57) ABSTRACT

Provided are an atomic layer sheet that contains boron and oxygen as framework elements, is networked by nonequilibrium couplings having boron-boron bonds, and has a molar ratio of oxygen to boron (oxygen/boron) of less than 1.5, a laminated sheet containing a plurality of such atomic layer sheets and metal ions between ones of the sheets, and a thermotropic liquid crystal and a lyotropic liquid crystal containing these. In addition, there is provided a method for manufacturing an atomic layer sheet and/or a laminated sheet containing boron and oxygen, the method including: adding $MBH_4$, where M represents an alkali metal ion, into a solvent containing an organic solvent in an inert gas atmosphere to prepare a solution; and exposing the solution to an atmosphere containing oxygen.

19 Claims, 30 Drawing Sheets

BORON ATOMIC LAYER

END OR DEFICIENT PART

B-B: 1.784 A

B-O: 1.339 A

B-O: 1.420 A

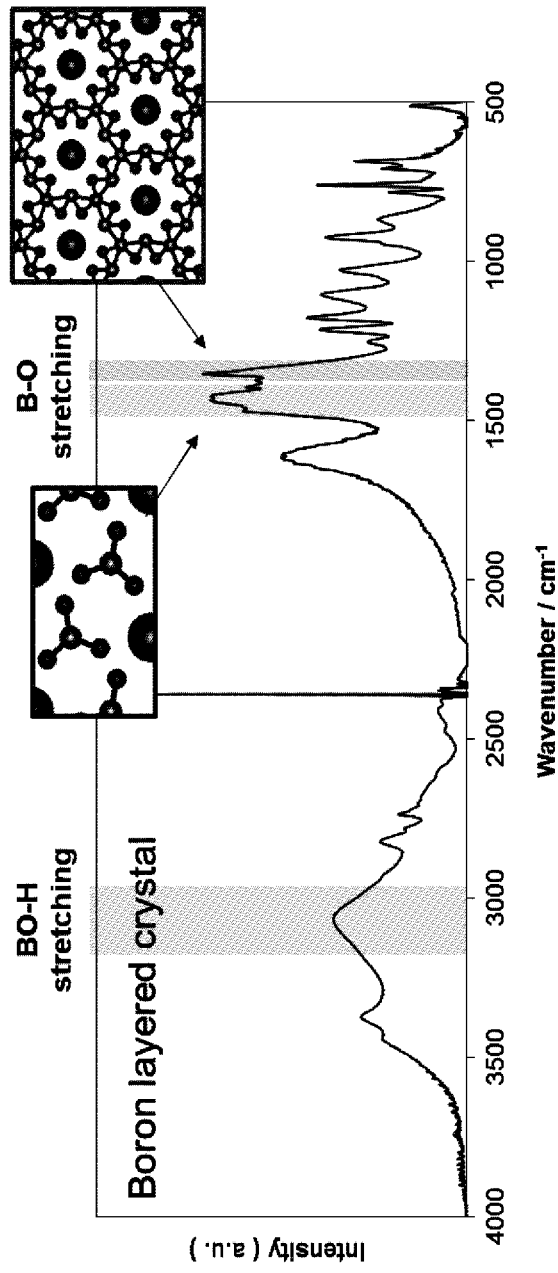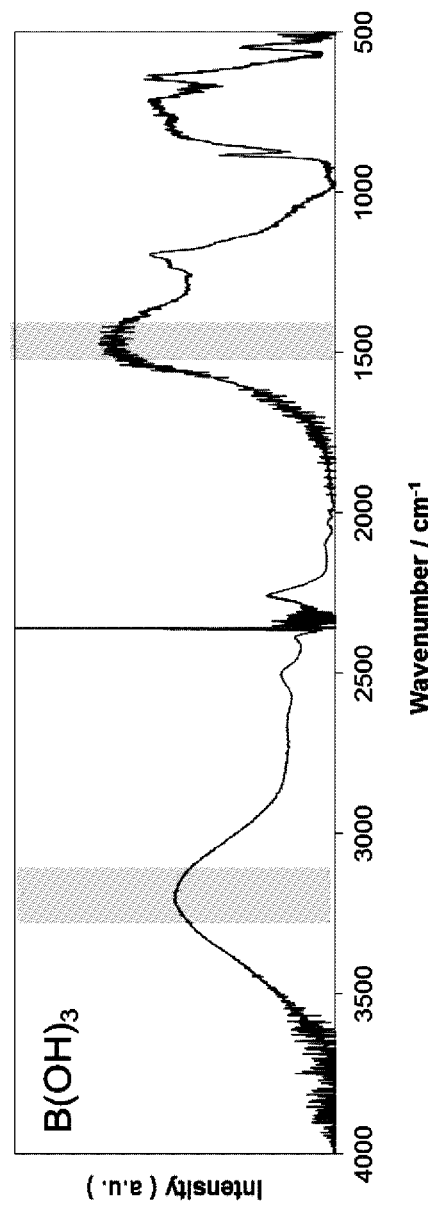
FIG.4A
FIG.4B

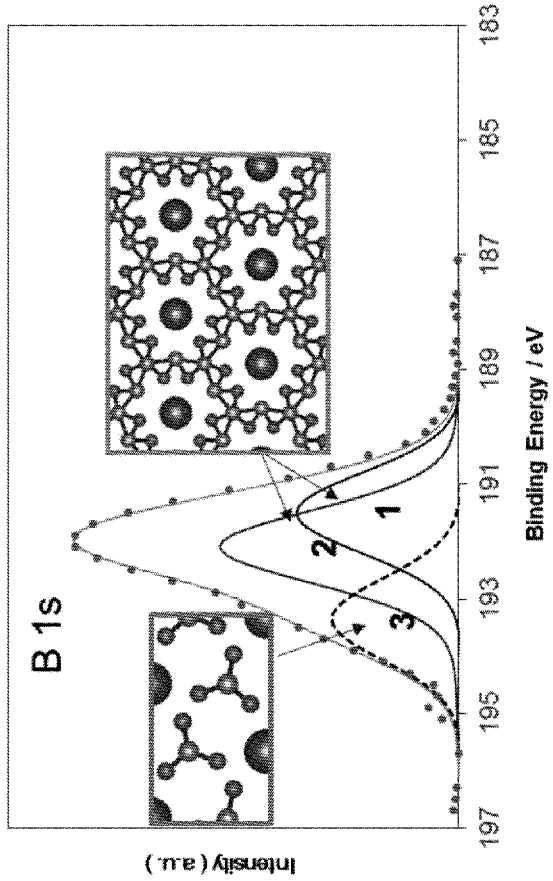
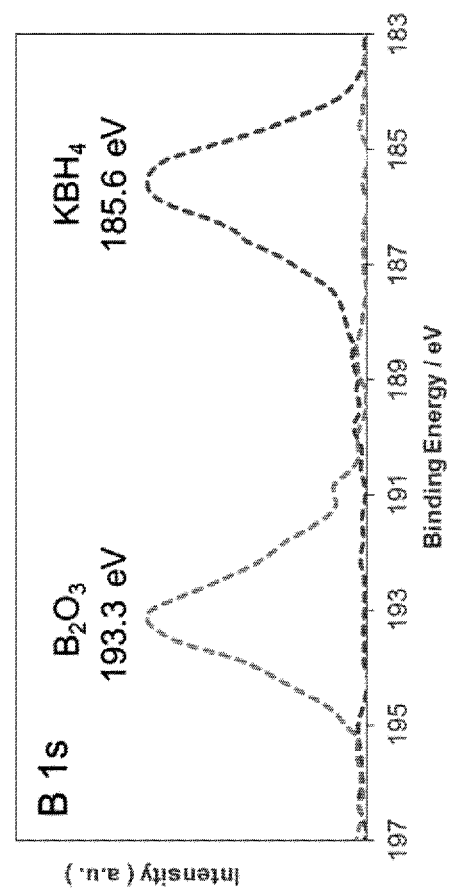
FIG.5A, FIG.5B, FIG.5C
|  | B.E. (eV) | AREA RATIO |
|---|---|---|
| KBH$_4$ | 185.6 | — |
| 1 | 191.5 | 0.30 |
| 2 | 192.1 | 0.45 |
| 3 | 193.3 | 0.24 |
| B$_2$O$_3$ | 193.3 | — |

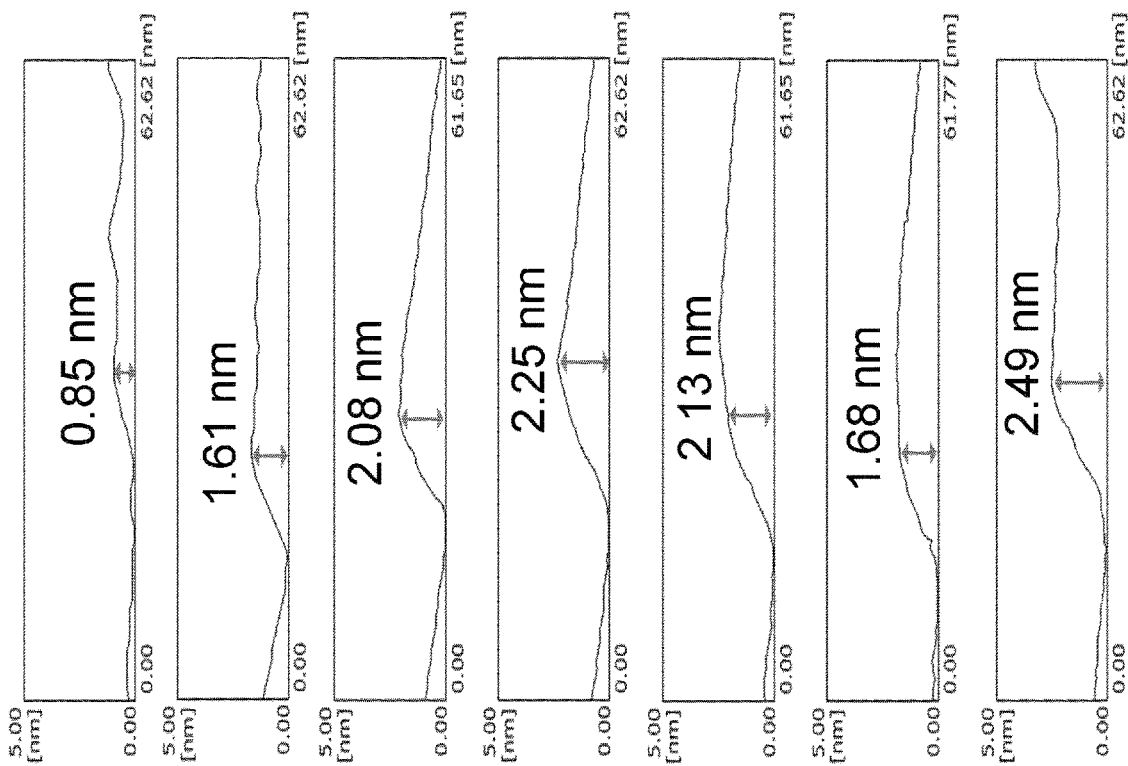
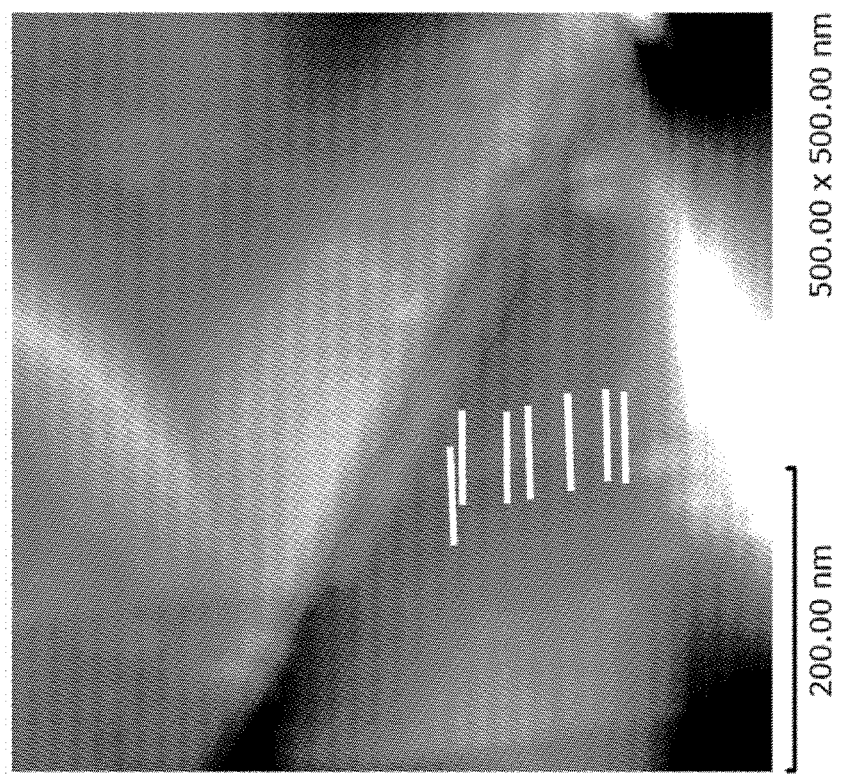

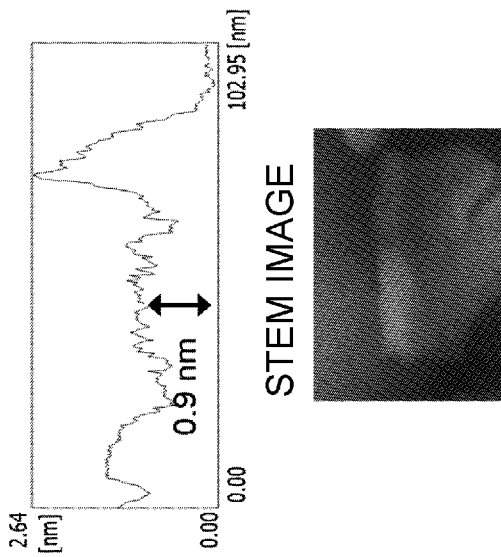
FIG. 11C
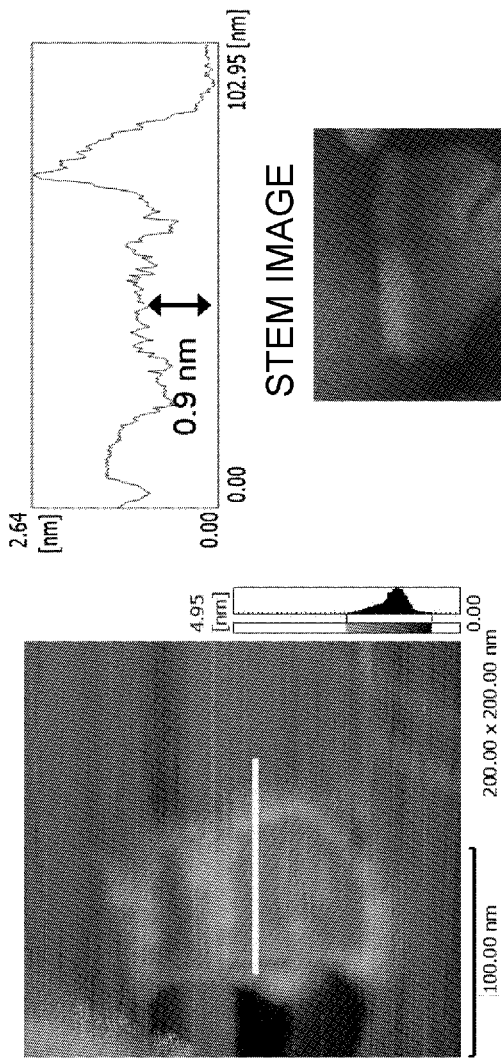
FIG. 11D STEM IMAGE
FIG. 11B SHAPE IMAGE
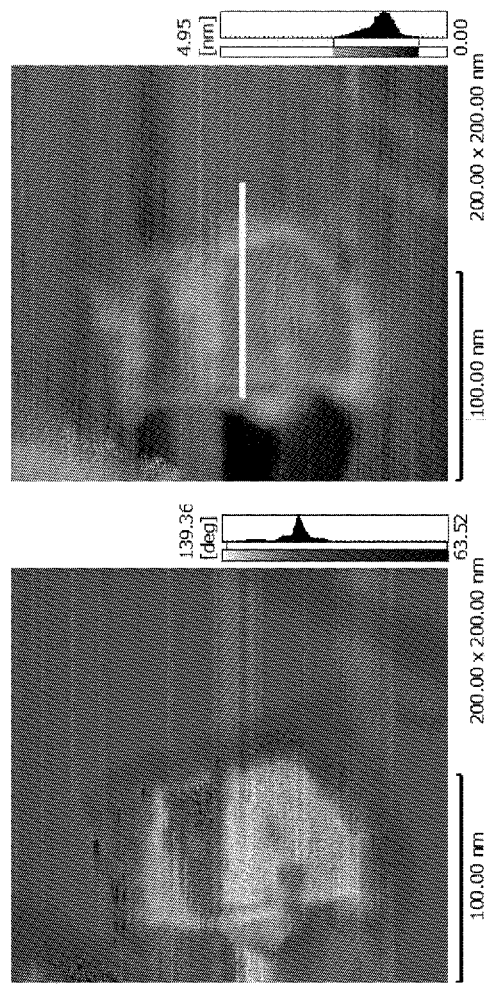
FIG. 11A PHASE IMAGE

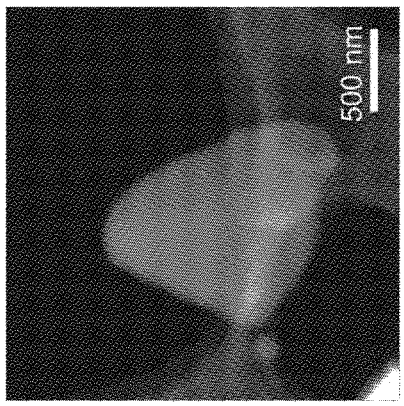
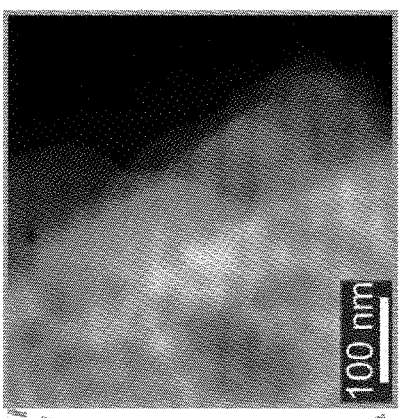
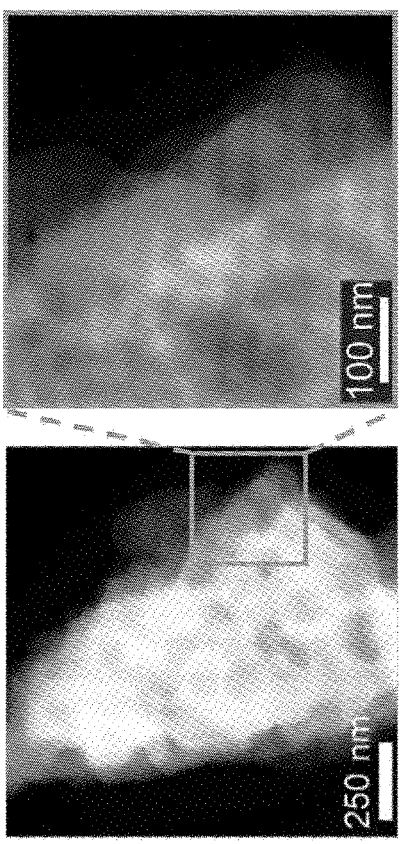
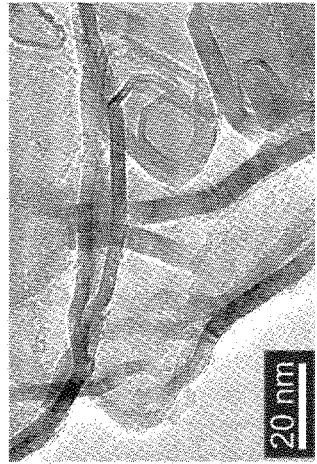
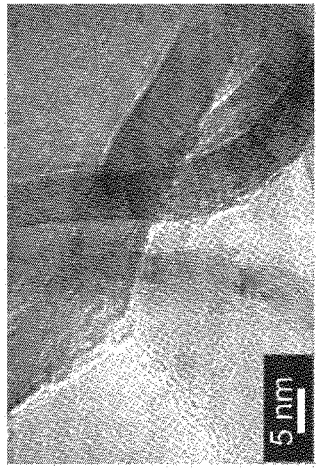
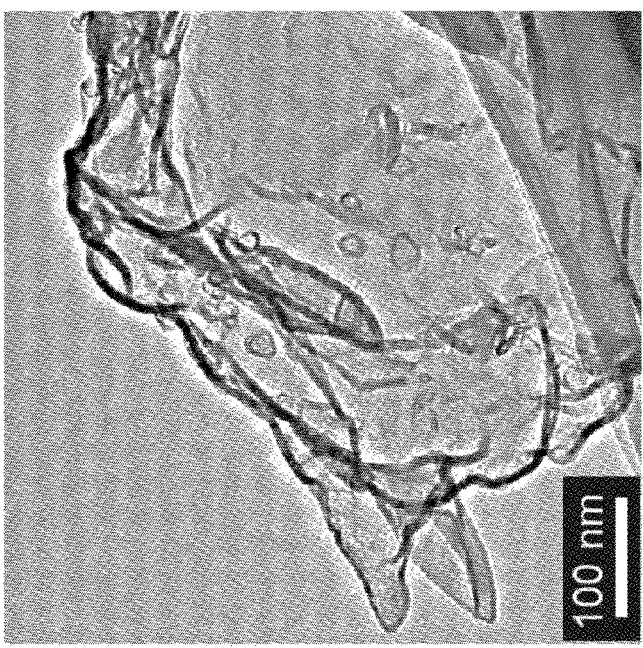

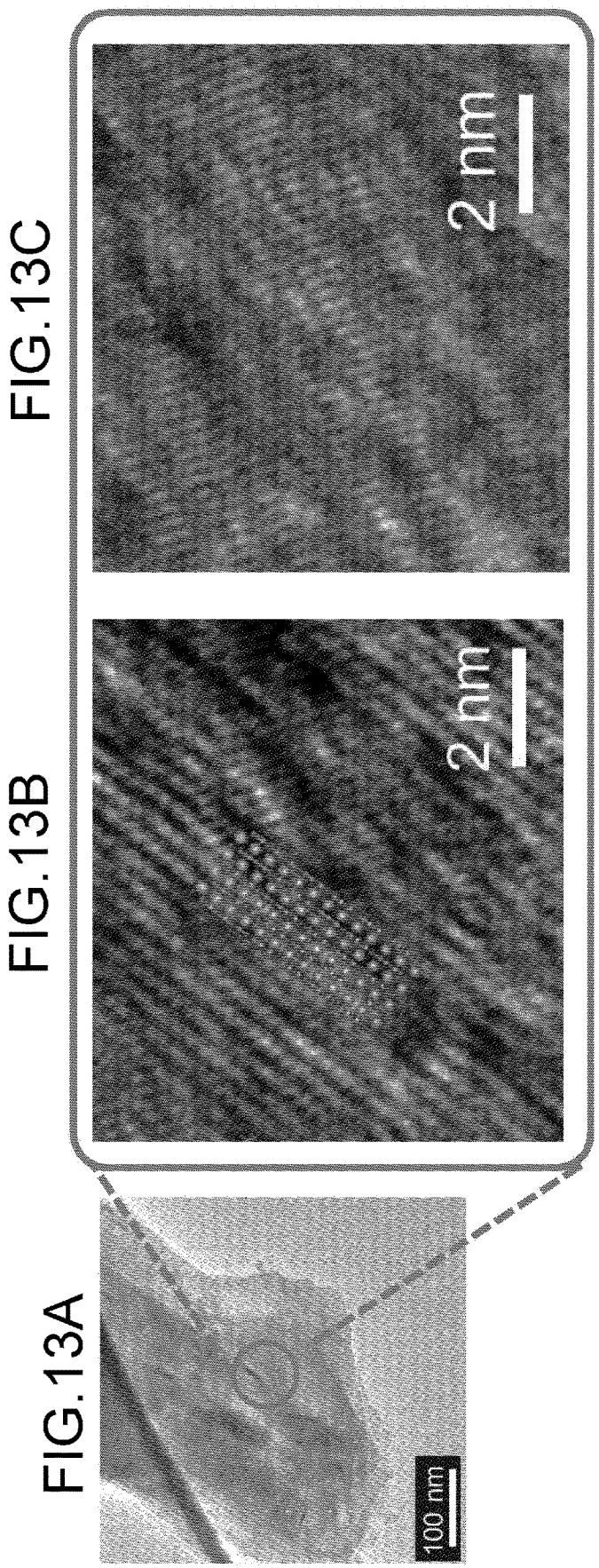

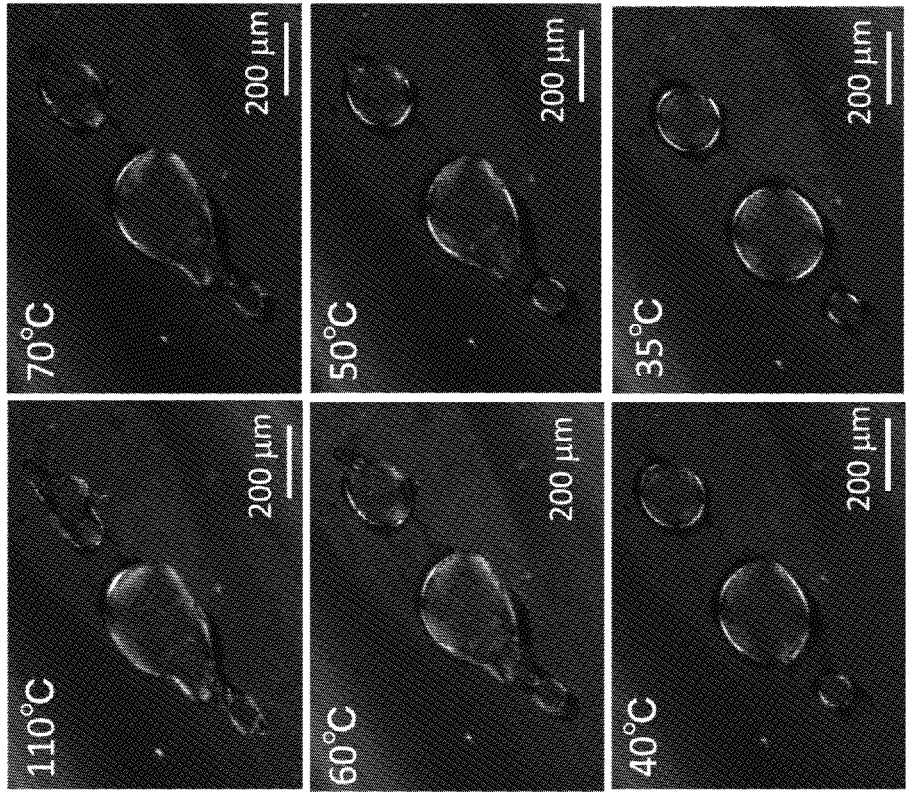
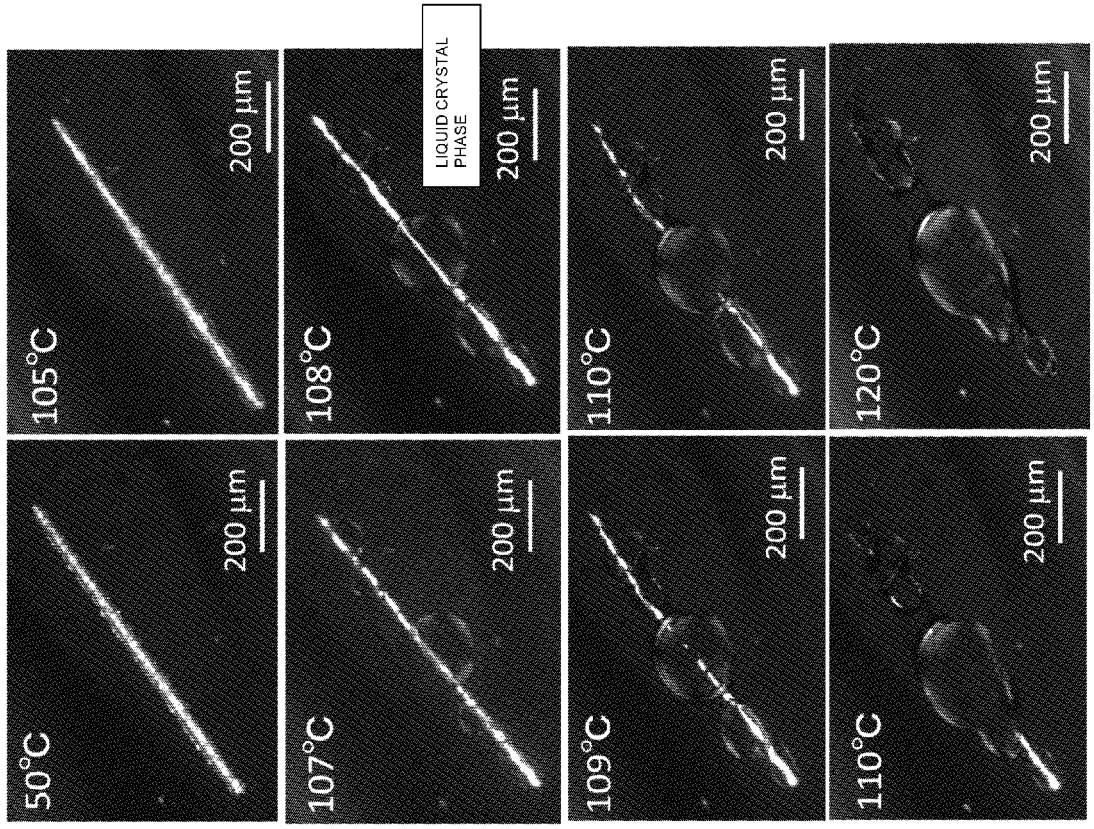

Boron layered crystals

B(OH)$_3$

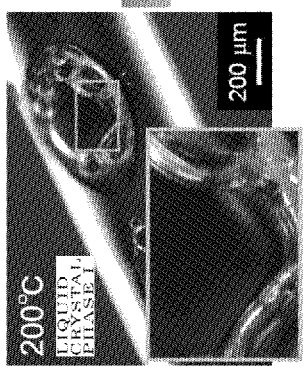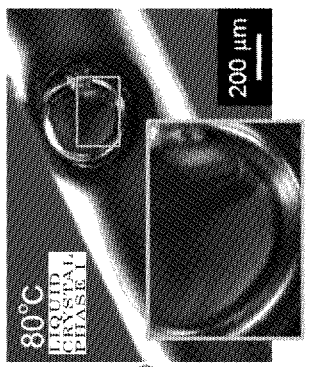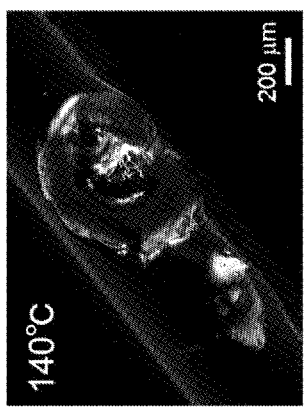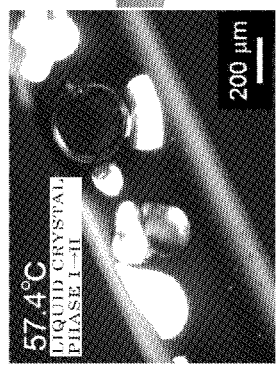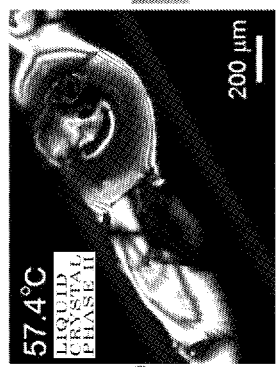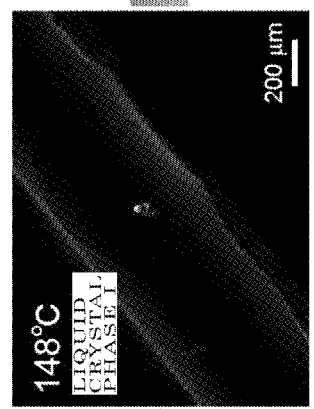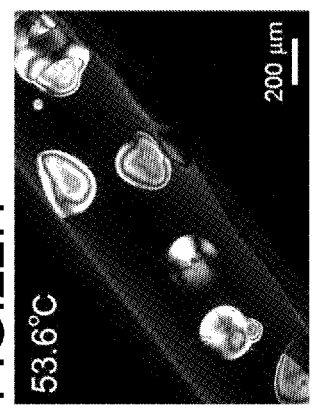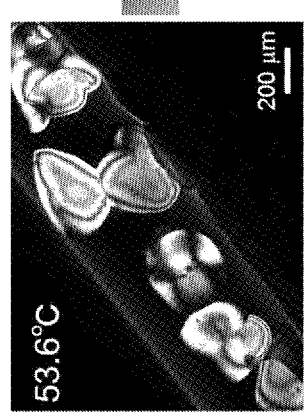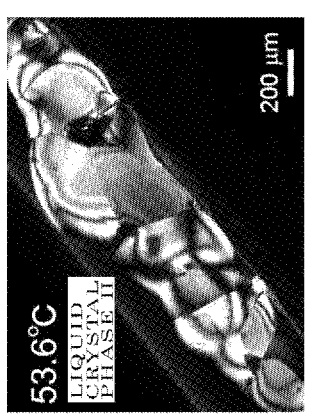

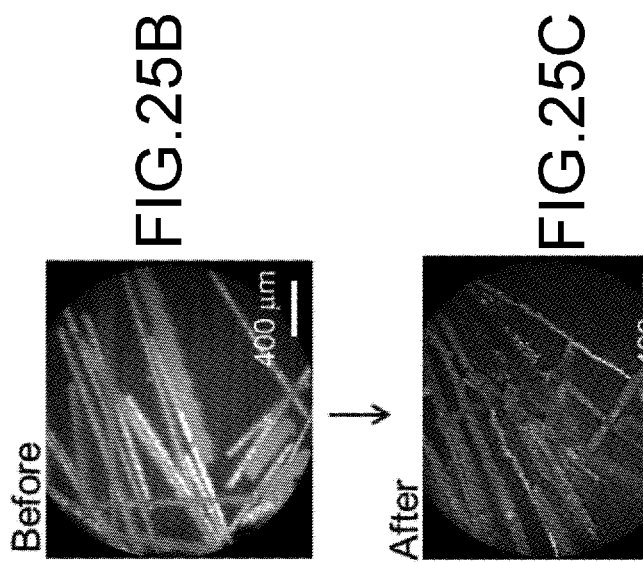
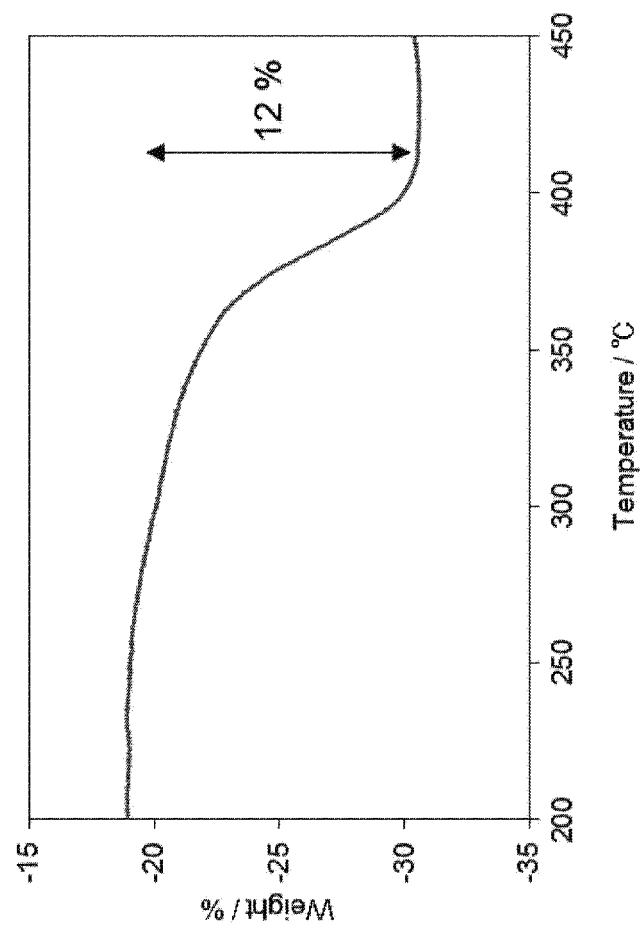
FIG.25A
FIG.25B
FIG.25C

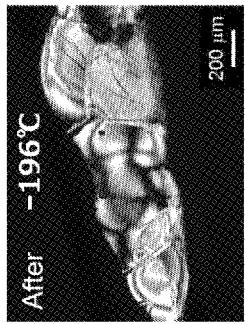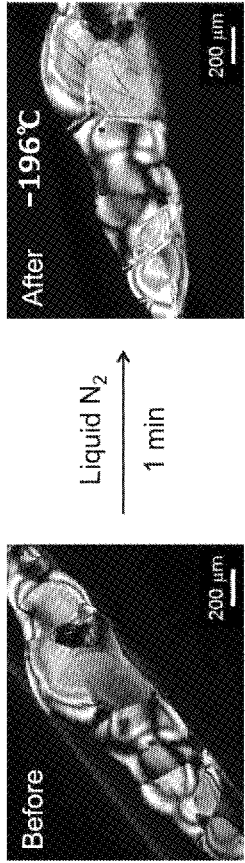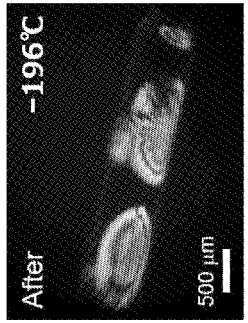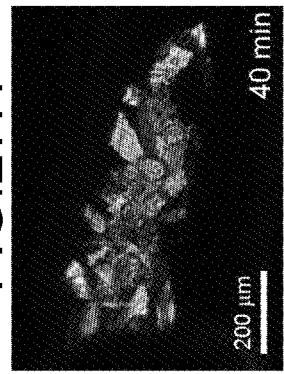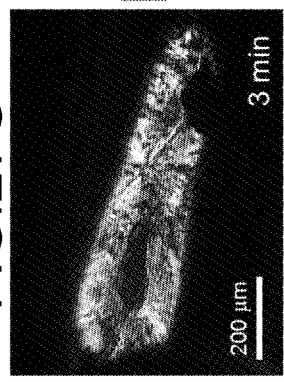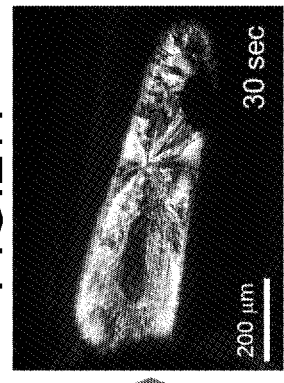

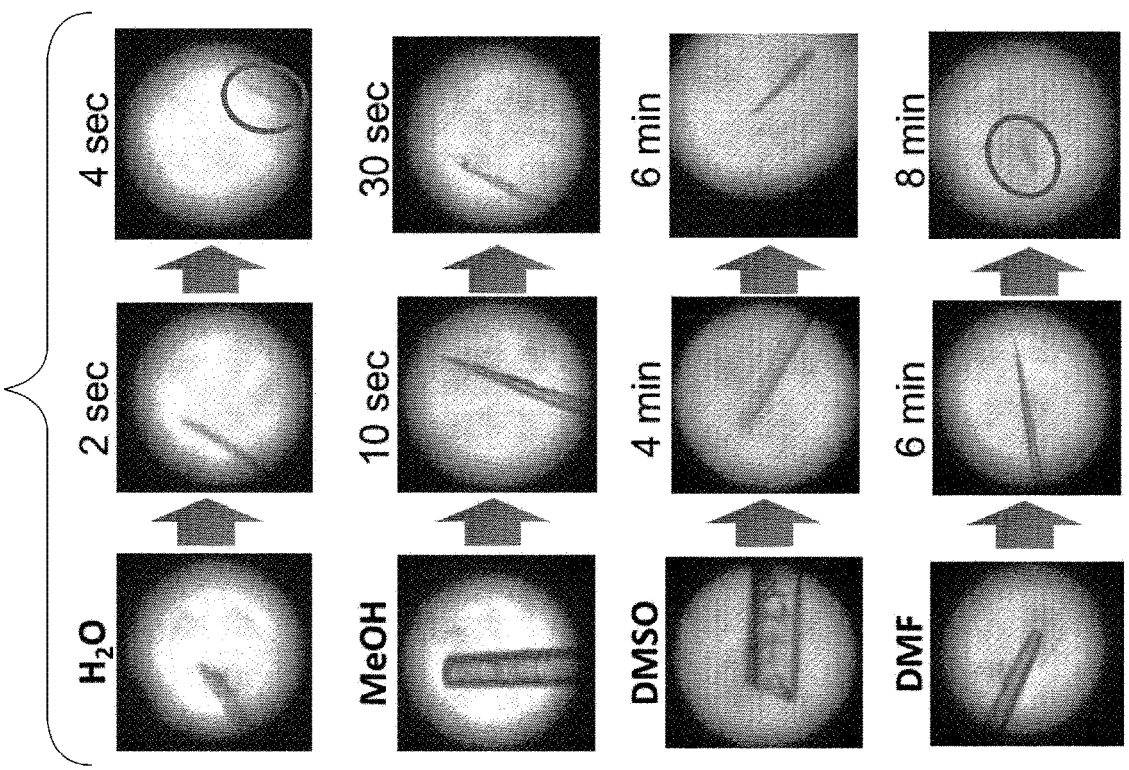

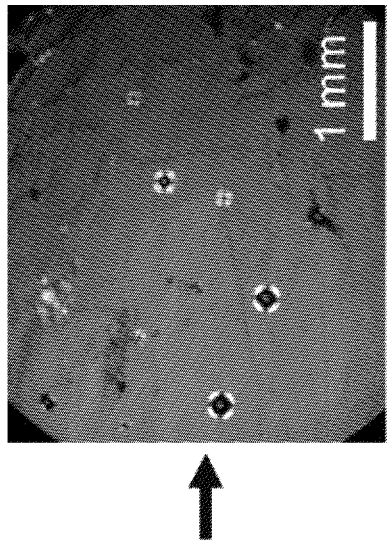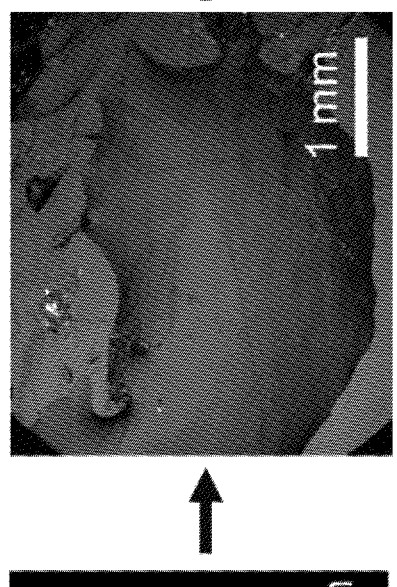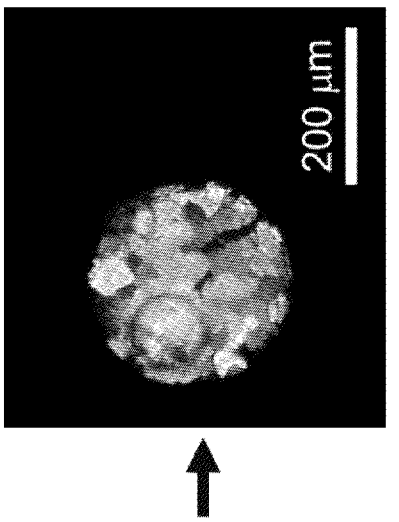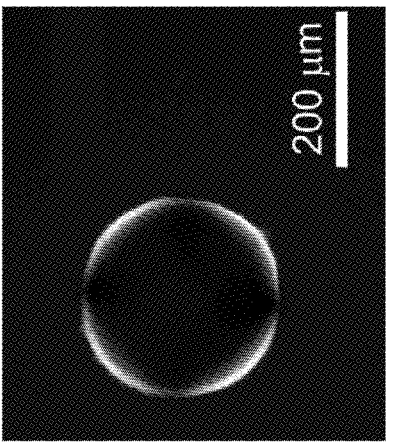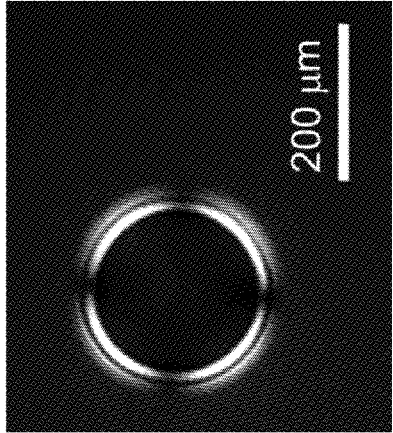

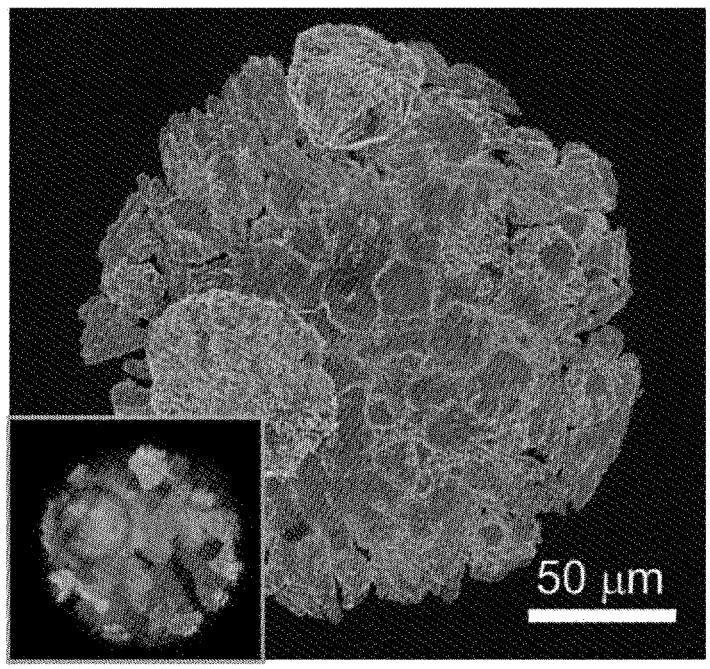
FIG. 30A
FIG. 30B
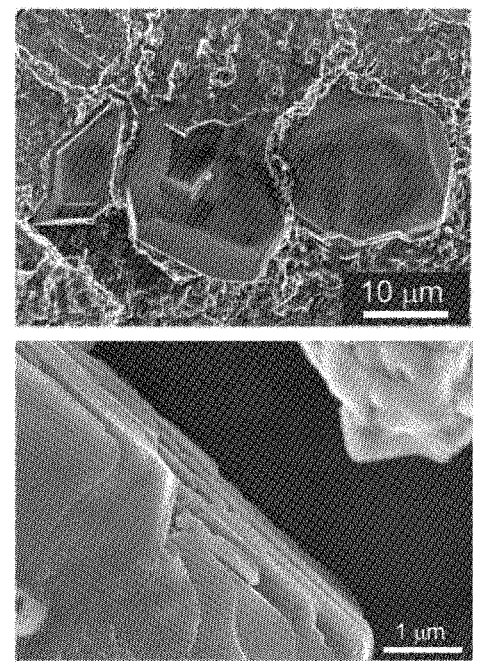
FIG. 30C
FIG. 30D
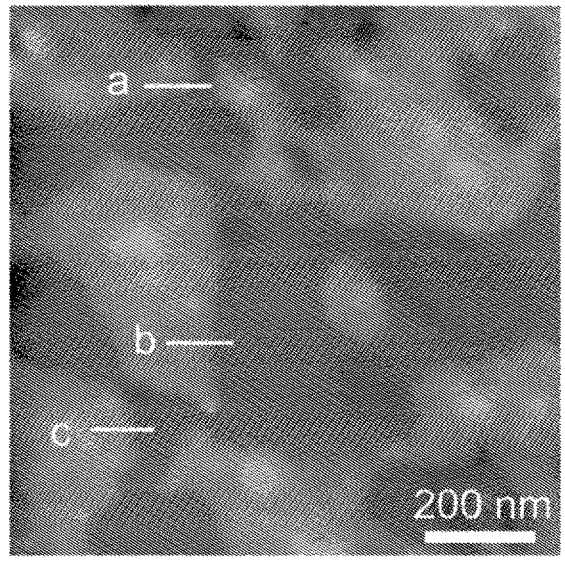
FIG. 31A
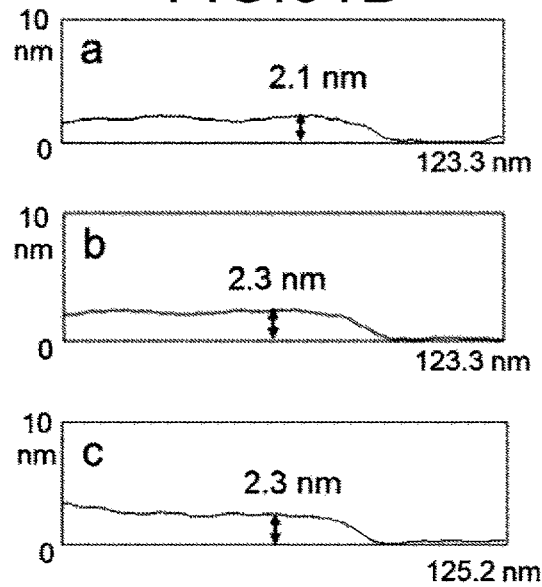
FIG. 31B

BORON ATOMIC LAYER SHEET AND LAMINATED SHEET, METHOD FOR MANUFACTURING THE SAME, AND LIQUID CRYSTALS

TECHNICAL FIELD

The present invention relates to a boron atomic layer sheet and a laminated sheet thereof, and a method for manufacturing the same, and liquid crystals.

BACKGROUND ART

Nanostructure bodies with minutely controlled structures, such as one-dimensional nanotubes and nanowires, two-dimensional layered substances and nanosheets, and three-dimensional porous substances and dendrimers, exhibit varied functions and physical properties by utilizing the space and the shape.

Among these, graphene, which is an atomic layer substance of carbon, is excellent in physical properties such as mechanical strength, thermal conductivity, and electrical conductivity; since it was discovered in 2004 that graphene can be obtained by adhering graphite to a Scotch tape and exfoliating it, applied research of graphene has been advanced; for example, graphene analogs have been studied from the viewpoints of modifications of graphene and alterations of constituent elements.

From the viewpoint of alterations of constituent elements, boron nitride (BN), silicene (Si), germanene (Ge), borophene (B), and the like are known. Borophene is a boron single-layer nanosheet; Wang et al. reported the synthesis of a borophene-like cluster by using a gas-phase vacuum system to synthesize a $B_{36}$ cluster consisting of 36 atoms and identifying its structure from comparison between a photoelectron spectrum and a simulation based on theoretical calculation (Non-Patent Document 1). After that, the synthesis of borophene as not a unit structure but a two-dimensionally spread sheet was reported by Guisinger et al. (Non-Patent Document 2) and Wu et al. (Non-Patent Document 3), which synthesis was accomplished by vacuum vapor deposition of boron on an Ag(111) plane in an ultrahigh vacuum. This borophene is a substance that cannot exist in the air. On the other hand, borophane is a boron single-layer nanosheet in which its terminal is protected with hydrogen; borophane has been expected to exceed graphene in the velocity of a Dirac particle and mechanical strength, and has been predicted to be able to exist in the air according to theoretical calculation; recently, the synthesis of borophane has been reported (Non-Patent Document 4).

A liquid crystal material used in every display is a very important functional material supporting modern society. The liquid crystal is in a state of matter exhibiting properties between those of a crystal and those of a liquid. The liquid crystal has the feature of having long-period orientation properties of molecules like in a crystal and yet exhibiting fluidity like in a liquid, and is in a phase that appears at intermediate temperatures between a crystal state at low temperature and a liquid crystal state at high temperature. Since the discovery of the first liquid crystal state in organic molecules was reported in 1888, the elucidation of physical and chemical properties thereof and the development of functions thereof have been actively made.

In order for such a liquid crystal state to be exhibited, it is necessary that both an anisotropic part to be arranged with unified directions and a part that produces fluidity be provided in a molecule. A common liquid crystal molecule has, in the structure, a rigid part containing a benzene ring and an alkyl chain at the terminal. Thereby, while rigid parts based on benzene rings are mutually oriented, alkyl chains exhibit fluidity; thus, long-period orientation of molecules like in a crystal and fluidity like in a liquid are exhibited simultaneously.

A liquid crystal that appears in an intermediate state between that of a crystal and that of a liquid in accordance with temperature change in this way is called a thermotropic liquid crystal. The thermotropic liquid crystal has the feature of having varied liquid crystal phases depending on temperature. In many cases, even the same liquid crystal molecule enters, at a low temperature close to the crystallization temperature, a state called a smectic phase in which the degree of orientation and regularity are relatively high, and enters, on the high temperature side close to the temperature of transition to a liquid, a nematic phase in which the degree of orientation is relatively low. The liquid crystal phase formed of such liquid crystal molecules greatly varies also with the structure and shape of the molecule. In addition, a chiral phase in which molecules are oriented while spiraling emerges in liquid crystal molecules having chirality in the structure and banana-like liquid crystal molecules having no asymmetric carbon atoms.

All the liquid crystal phases described above relate to rod-like molecules of which the rigid parts have one-dimensional anisotropy; however, also planar molecules, such as a phthalocyanine and a triphenylene in which an alkyl chain has been introduced, exhibit a liquid crystal phase by the stacking of disc-like molecules. Thus, a thermotropic liquid crystal can exhibit varied liquid crystal phases by utilizing one-dimensional or two-dimensional anisotropy possessed by the molecule.

On the other hand, there is also a liquid crystal phase called a lyotropic liquid crystal, which is developed not only by a liquid crystal change based on temperature but also in a solution. The lyotropic liquid crystal is a liquid crystal phase mainly seen in a surfactant that has, in the structure, a hydrophobic part based on an alkyl chain and an ionic hydrophilic part. Surfactant molecules in an aqueous solution build various micelle structures by self-organization based on the hydrophobic effect etc., and form a long-period structure particularly at high concentration. This is a state where molecules are, although dissolved in a solution, periodically arranged like in a crystal, and is therefore regarded as a liquid crystal and widely researched. Unlike the thermotropic liquid crystal, the phase change of which depends only on temperature, the lyotropic liquid crystal has, due to being in a solution, a feature in which the phase change strongly depends on the concentration of liquid crystal molecules.

Most of the current thermotropic liquid crystals are completely organic molecules, but there is also an example in which compositing with an inorganic compound is performed. This is a liquid crystal molecule in which an inorganic unit has been introduced in a rigid part of the molecule; and liquid crystal molecules using, as inorganic domains, metal complexes having relatively small sizes, or clusters or metal nanoparticles having relatively large sizes are synthesized (Non-Patent Documents 5 to 7).

However, even among liquid crystals having inorganic domains, all of them necessarily contain alkyl chains in the structure. This is considered to be because, in the liquid crystal state, soft alkyl chains are in a state of being almost fused and play the role of a solvent that dissolves rigid parts in the liquid crystal. Hence, even though the rigid part can be constructed by using an inorganic unit, the alkyl chain that produces fluidity cannot be replaced; and there has been no report on any example of a thermotropic liquid crystal composed only of a completely inorganic compound.

While the thermotropic liquid crystal has had no report on any example of a completely inorganic liquid crystal, the lyotropic liquid crystal has a report by Gabriel et al. in 2001 of a completely inorganic liquid crystal based on a layered phosphate (Non-Patent Document 8). The present authors paid attention to strong two-dimensional anisotropy possessed by a nanosheet in an inorganic layered substance, and have found that lyotropic liquid crystallinity is developed in a dispersion liquid by dispersing, in water, phosphoric acid nanosheets exfoliated from a layered phosphate. The liquid crystallinity of the phosphoric acid nanosheets has been found from the fact that, when the dispersion liquid was observed under a polarizing microscope, interference colors produced by double refraction based on a long-period structure were seen while a dispersion liquid state was exhibited. Further, it has been found that the change of the liquid crystal phase depends on the concentration of nanosheets in the dispersion liquid, like in a lyotropic liquid crystal based on surfactant molecules.

With this discovery as a trigger, attention has been focused on the potential of inorganic nanosheets for the exhibition of liquid crystals, and a field called an inorganic nanosheet liquid crystal has grown (Non-Patent Document 9). Such inorganic nanosheet liquid crystals had been reported for ionic layered substances such as metal oxides and clay minerals for which the exfoliating method in a dispersion liquid had been established; however, since 2010, there have been also reports on nanosheets that are hard to exfoliate in a solution, such as graphene (Non-Patent Document 10) and graphene oxide (Non-Patent Document 11) based on exfoliating from graphite.

PRIOR ART DOCUMENTS

Non-Patent Document(s)

Non-Patent Document 1: Nat Commun 2014, 5, 3113.
Non-Patent Document 2: Science 350, 1513-1516 (2015).
Non-Patent Document 3: Nat. Chem., 8, 563-568 (2016).
Non-Patent Document 4: https://www.tohoku.ac.p/japanese/2017/09/press20170926-02.html
Non-Patent Document 5: Coordin. Chem. Rev., 340, 79-97 (2017).
Non-Patent Document 6: Acc. Chem. Res., 49, 1514-1523 (2016).
Non-Patent Document 7: Soft Matter., 6, 5397-5400 (2010).
Non-Patent Document 8: Nature 413, 504-508, (2001).
Non-Patent Document 9: Isr. J. Chem., 52, 881-894 (2012).
Non-Patent Document 10: Nat. Nanotechnol., 5, 406-411 (2010).
Non-Patent Document 11: Angew. Chem. Int. Ed., 50, 3043-3047 (2011).

SUMMARY OF THE INVENTION

The following invention is provided on the basis of findings that, in the above background, an unprecedented novel boron atomic layer sheet and a heretofore-nonexistent novel laminated sheet have been obtained.

[1A] An atomic layer sheet including boron and oxygen as framework elements, in which the atomic layer sheet is networked by nonequilibrium couplings having boron-boron bonds, and has a molar ratio of oxygen to boron (oxygen/boron) of less than 1.5.

[2A] The atomic layer sheet according to [1A], further including alkali metal ions, in which a molar ratio of alkali metal ion to boron (alkali metal ion/boron) is less than 1.

[3A] The atomic layer sheet according to [1A] or [2A], in which the atomic layer sheet is an oxidation product of $MBH_4$, where M represents an alkali metal ion.

[4A] The atomic layer sheet according to any one of [1A] to [3A], in which a composition of the framework is $B_5O_3$.

[5A] The atomic layer sheet according to [4A], in which the framework has three-fold symmetry having boron-boron bonds.

[6A] The atomic layer sheet according to [4A] or [5A], including: a constituent X that serves as the framework; and a constituent Y other than the constituent X.

[7A] The atomic layer sheet according to [6A], in which the constituent Y is a terminal part and/or a deficient part.

[8A] The atomic layer sheet according to [6A] or [7A], in which the constituent Y is a boron oxide part containing B—OH.

[9A] The atomic layer sheet according to any one of [6A] to [8A], in which, in X-ray photoelectron spectrometry, the atomic layer sheet has a peak derived from a B-1s level at each of range of 190.5 to 193.0 eV, and 192.5 to 194.0 eV.

[10A] The atomic layer sheet according to [9A], in which, in the X-ray photoelectron spectrometry, the peak at a range of 190.5 to 193.0 eV corresponds to the constituent X.

[11A] The atomic layer sheet according to any one of [6A] to [10A], in which, in IR measurement, the atomic layer sheet has two kinds of peaks derived from B—O stretching at around 1300 to 1500 $cm^{-1}$, and further has a peak derived from BO—H stretching at around 3100 $cm^{-1}$.

[12A] The atomic layer sheet according to [11A], in which, in the IR measurement, a peak on a low wave number side out of the two kinds of peaks derived from B—O stretching corresponds to the constituent X.

[13A] A laminated sheet including: a plurality of atomic layer sheets each according to any one of [1A] to [12A]; and metal ions between the plurality of atomic layer sheets.

[14A] The laminated sheet according to [13A], in which the metal ion is an alkali metal ion.

[15A] The laminated sheet according to [14A], in which a molar ratio of alkali metal ion to boron (alkali metal ion/boron) is less than 1.

[16A] A crystal including: the laminated sheet according to any one of [13A] to 15A].

[17A] A method for manufacturing an atomic layer sheet and/or a laminated sheet containing boron and oxygen, the method including: adding $MBH_4$, where M represents an alkali metal ion, into a solvent containing an organic solvent in an inert gas atmosphere to prepare a solution; and exposing the solution to an atmosphere containing oxygen.

[18A] The method according to [17A], in which the atomic layer sheet is an atomic layer sheet that has boron and oxygen as framework elements, is networked by nonequilibrium couplings having boron-boron bonds, and has a molar ratio of oxygen to boron (oxygen/boron) of less than 1.5, and the laminated sheet contains a plurality of the atomic layer sheets and metal ions between the plurality of atomic layer sheets.

[19A] The method according to [18A], in which the metal ion is an alkali metal ion, and a molar ratio of alkali metal ion to boron (alkali metal ion/boron) is less than 1.

[20A] A method for manufacturing an exfoliated substance of a laminated sheet, the method including adding the laminated sheet according to any one of [13A] or [15A] and at least one selected from a crown ether and a cryptand into a solvent containing an organic solvent to exfoliate the laminated sheet.

[21A] A method for manufacturing an exfoliated substance of a laminated sheet, the method including adding the laminated sheet according to any one of [13A] to [15A] into an aprotic highly polar solvent to exfoliate the laminated sheet.

[22A] The method according to [20A] or [21A], in which the exfoliated substance contains an atomic layer sheet of a single layer.

The boron atomic layer sheet and the laminated sheet of the present invention can be expected to be used for various industries on the basis of the structural features disclosed below. The bottom-up synthesis and the liquid-phase synthesis under atmospheric pressure, and the stability in the air of an atomic layer substance of boron are distinctive findings in contrast to conventional technology, and the boron layered single crystal can be turned to single layers by a physical method or a chemical dissolution method. A sheet substance with a thickness equivalent to a single layer can be obtained on a substrate by applying physical force to the crystal. The layered single crystal is not dissolved in common aprotic organic solvents, but is dissolved by adding a cryptand or a crown ether that traps interlayer metal ions. It is surmised that, in a state where metal ions are dissolved out, also boron sheets are dispersed as single layers in the solution.

Further, the following invention is provided on the basis of findings that a heretofore-nonexistent novel boron atomic layer sheet and a heretofore-nonexistent novel laminated sheet have been obtained and further liquid crystallinity is shown.

[1B] A thermotropic liquid crystal including an atomic layer sheet including: boron and oxygen as framework elements, in which the atomic layer sheet is networked by nonequilibrium couplings having boron-boron bonds, and has a molar ratio of oxygen to boron (oxygen/boron) of less than 1.5.

[2B] The thermotropic liquid crystal according to [1B] including: a laminated sheet incorporating metal ions between a plurality of the atomic layer sheets.

[3B] The thermotropic liquid crystal according to [2B], in which the metal ion is an alkali metal ion, and the laminated sheet has a molar ratio of alkali metal ion to boron (alkali metal ion/boron) of less than 1.

[4B] The thermotropic liquid crystal according to any one of [1B] to [3B], in which the thermotropic liquid crystal holds a liquid crystal state at least in a temperature region of −196 to 350° C.

[5B] The thermotropic liquid crystal according to any one of [1B] to [4B], in which phase transition reversible with respect to temperature is able to be controlled between liquid crystal phase I on a high temperature side and liquid crystal phase II on a low temperature side.

[6B] The thermotropic liquid crystal according to any one of [1B] to [5B], in which the atomic layer sheet is an oxidation product of $MBH_4$, where M represents an alkali metal ion.

[7B] The thermotropic liquid crystal according to any one of [1B] to [6B], in which the atomic layer sheet has a composition of a framework of $B_5O_3$.

[8B] The thermotropic liquid crystal according to [7B], in which the framework of the atomic layer sheet has three-fold symmetry having boron-boron bonds.

[9B] The thermotropic liquid crystal according to [7B] or [8B], in which the atomic layer sheet contains a constituent X that serves as the framework and a constituent Y other than the constituent X.

[10B] The thermotropic liquid crystal according to [9B], in which the constituent Y is a terminal part and/or a deficient part.

[11B] The thermotropic liquid crystal according to [9B] or [10B], in which the constituent Y is a boron oxide part containing a $B_2O_3$ unit.

[12B] A method for manufacturing the thermotropic liquid crystal according to any one of [1B] to [11B], the method including heating, to more than or equal to 100° C., a crystal containing a laminated sheet incorporating metal ions between a plurality of atomic layer sheets each of which has boron and oxygen as framework elements, is networked by nonequilibrium couplings having boron-boron bonds, and has a molar ratio of oxygen to boron (oxygen/boron) of less than 1.5.

[13B] The method for manufacturing the thermotropic liquid crystal according to [12B], in which a distance between the atomic layer sheets is increased by the heating.

[14B] The method for manufacturing the thermotropic liquid crystal according to [12B] or [13B], in which dehydration condensation reaction between bonds of B—OH in a terminal part and/or a deficient part of the atomic layer sheet progresses by the heating.

[15B] A lyotropic liquid crystal including an atomic layer sheet including boron and oxygen as framework elements, in which the atomic layer sheet is networked by nonequilibrium couplings having boron-boron bonds, and has a molar ratio of oxygen to boron (oxygen/boron) of less than 1.5.

[16B] The lyotropic liquid crystal according to [15B] including a laminated sheet incorporating metal ions between a plurality of the atomic layer sheets.

[17B] The lyotropic liquid crystal according to [15B] or [16B], in which the metal ion is an alkali metal ion, and the laminated sheet has a molar ratio of alkali metal ion to boron (alkali metal ion/boron) of less than 1.

[18B] The lyotropic liquid crystal according to any one of [15B] to [17B], in which the atomic layer sheet has a composition of a framework of $B_5O_3$.

[19B] The lyotropic liquid crystal according to [18B], in which the framework of the atomic layer sheet has three-fold symmetry having boron-boron bonds.

[20B] The lyotropic liquid crystal according to [18B] or [19B], in which the atomic layer sheet contains a constituent X that serves as the framework and a constituent Y other than the constituent X.

[21B] The lyotropic liquid crystal according to [20B], in which the constituent Y is a terminal part and/or a deficient part.

[22B] The lyotropic liquid crystal according to [20B] or [21B], in which the constituent Y is a boron oxide part containing B—OH.

[23B] A composition including: a solvent; and the lyotropic liquid crystal according to any one of [15B] to [22B] existing in the solvent.

[24B] The composition according to [23B], in which the solvent is N,N-dimethylformamide.

The bottom-up synthesis and the liquid-phase synthesis, and the stability in the air of an atomic layer substance of boron, such as the boron atomic layer sheet and the laminated sheet as described above, are distinctive findings in contrast to conventional technology, and the boron layered crystal is changed into a liquid crystal by heating. So far, inorganic compounds have had no example of such change to a liquid crystal simply by heat; thus, the first solventless liquid crystallization using a completely inorganic compound has been achieved. Although the change from a boron layered crystal to a boron liquid crystal is an irreversible change involving chemical change, reversible phase transition with respect to temperature between liquid crystal phases has been shown; thus, it has been shown that the boron liquid crystal is not only the first solventless liquid crystal using a completely inorganic substance but also the first thermotropic liquid crystal. The temperature range in which the boron liquid crystal can hold a liquid crystal phase is from at least −50° C. on the low temperature side to at least 350° C. on the high temperature side. For the liquid crystal temperature ranges of common organic liquid crystals, for example, 5CB, which is the best known one used for displays, has 23 to 37° C., and others generally have temperature ranges of approximately 10 to 30° C. On the other hand, there is also a considerably wide range of more than 100° C. In contrast to these, the liquid crystal temperature range of the boron liquid crystal reaches approximately 400° C., and the liquid crystal phase can be held in a very wide temperature range that current organic liquid crystals cannot achieve. Such very high stability of the boron liquid crystal is exhibited presumably by the strong two-dimensional anisotropy of the boron sheet, and is presumed to be stability derived from the structure peculiar to the inorganic compound having nanosheets. From such characteristics, the boron liquid crystal is expected to be industrially used in various technical fields such as optical elements of displays, electronic devices, and external field response elements.

The boron atomic layer sheet and the laminated sheet exhibit lyotropic liquid crystallinity by virtue of their very strong anisotropy, by dispersing such sheets in a solvent at an appropriate concentration to create a state where the sheets are oriented together. From such characteristics, the boron atomic layer sheet and the laminated sheet are expected to be industrially used in various technical fields by utilizing the properties peculiar to the liquid crystallinity and the inorganic compound, such as for external field responsiveness, compositing into high molecular materials, the synthesis of microfibers, and utilization for high-efficiency photocatalysts.

BRIEF DESCRIPTION OF DRAWINGS

FIGS. 2A to 2C denote diagrams showing a structure of a boron layered crystal based on X-ray structure analysis, in which FIG. 2A shows a cross section of a layered form, and FIG. 2 and FIG. 2 show a planar crystal structure.

FIGS. 3A to 3C denote diagrams showing the structure of the boron layered crystal based on X-ray structure analysis, in which FIG. 3A shows an estimated structure of a unit cell of a boron atomic layer, FIG. 3 shows an estimated structure of a unit cell of an terminal or deficient part, and FIG. 3C shows the distances of a B-B bond and B—O bonds.

FIGS. 4A and 4B denote IR spectra of the boron layered crystal (FIG. 4A) and $B(OH)_3$ (FIG. 4B).

FIG. 5A denotes an XPS spectrum of the boron layered crystal, and FIG. 5B denotes an XPS spectra of $B_2O_3$ and $KBH_4$, and FIG. 5C denotes results by the XPS measurement.

FIGS. 9A to 9D denote AFM images of nanosheets exfoliated from the boron layered crystal.

FIG. 10A denotes an AFM image and FIG. 10B denotes height profiles of nanosheets exfoliated from the boron layered crystal.

FIGS. 11A and 11B denote AFM images of nanosheets obtained by dissolving the boron layered crystal in a crown ether and performing casting on an HOPG substrate, FIG. 11C denotes height profiles, and FIG. 11D denotes STEM image.

FIGS. 12A to 12C denote STEM images of nanosheets exfoliated from the boron layered crystal, and FIGS. 12D to 12F denote high-resolution TEM images of the nanosheets.

FIGS. 13A to 13C denote high-resolution TEM images of a lattice pattern of nanosheets exfoliated from the boron layered crystal.

FIG. 14A denotes polarizing microscope images of a phase transition process from a crystal to a liquid crystal of the boron layered crystal during heating from 50° C. to 120° C., and FIG. 14B denotes polarizing microscope images of shape changes of the boron layered crystal during cooling from 120° C. to 35° C.

FIGS. 22A to 22J denote polarizing microscope images of the boron liquid crystal during phase transition from liquid crystal phase I to liquid crystal phase II and during reversible phase transition between liquid crystal phase I and liquid crystal phase II.

FIG. 25A denotes a TG curve of the boron liquid crystal at high temperatures and FIGS. 25B and 25C denote photographs of a sample before and after treatment.

FIGS. 27A to 27D denote denotes polarizing microscope images before (FIGS. 27A and 27C) and after (FIGS. 27B and 27D) the boron liquid crystal was immersed in liquid nitrogen for 1 minute and 12 hours, and FIGS. 27E to 27H denote polarizing microscope images of the boron liquid crystal rapidly cooled and phase changes thereof.

FIG. 28A denotes optical microscope images of dissolved boron layered crystals and FIG. 28B denotes the results of measurement of the solubility of boron layered crystals in various solvents.

FIGS. 29A to 29C denote optical microscope images showing the formation of a lyotropic liquid crystal in DMF, and FIGS. 29D to 29F denote optical microscope images showing a DMF volatilization process of a lyotropic liquid crystal and the production of a crystal.

FIGS. 30A to 30D denote SEM images of crystals accumulated after DMF volatilization.

FIG. 31A denotes an AFM image of a boron nanosheet exfoliated by dissolution in DMF, and FIG. 31B denotes height profiles.

EMBODIMENTS FOR CARRYING OUT THE INVENTION

Figure 1A:
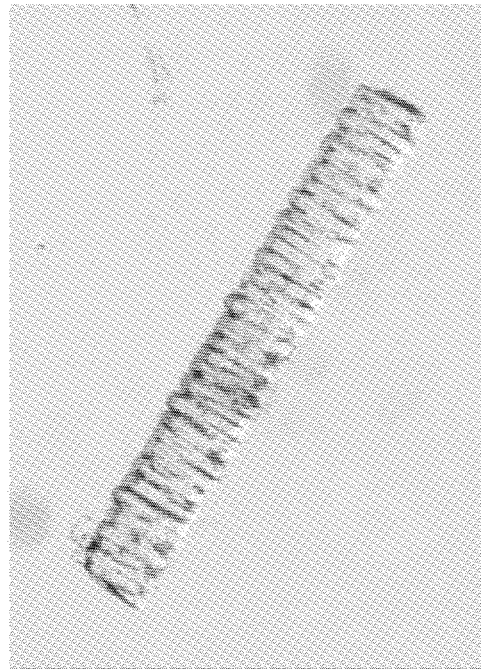
FIGS. 1A and 1B denote photographs of an acicular crystal synthesized in an Example of the present invention.

Hereinbelow, the present invention is described in detail.

1. Boron Atomic Layer Sheet and Laminated Sheet

In the present invention, an "atomic layer sheet" is a sheet of a single atomic layer containing boron and oxygen as main constituent atoms, and includes not only an independent single-layer sheet but also a single-layer sheet existing as a partial constituent in a laminated sheet, a metal ion-containing single-layer sheet in which metal ions that keep the balance of charge are bonded to an independent single-layer sheet, and the like. In the present specification, the atomic layer sheet is written also as a boron atomic layer sheet, a nanosheet, etc. A "laminated sheet" is a layered substance containing atomic layer sheets each mentioned above and metal ions between atomic layer sheets, and is described also as a boron layered crystal, etc. in the present specification.

Borophene is a single layered substance consisting only of boron atoms; the structure and the stability of borophene are discussed by the ratio between triangular cells created by boron and hexagonal vacancies formed of $sp^2$ boron. The reason why triangular cells are present is generally considered to be that a simple substance and a cluster of boron form a stable structure with a multicentric-bond-based triangular cell as a unit. In the present invention, "be networked by nonequilibrium couplings having boron-boron bonds" is an expression of a two-dimensional bonding manner in conformity with the discussion of a conventional bonding style in a boron-containing atomic layer sheet such as borophene.

(Atomic Layer Sheet)

The atomic layer sheet of the present invention has boron and oxygen as framework elements, is networked by nonequilibrium couplings having boron-boron bonds, and has a molar ratio of oxygen to boron (oxygen/boron) of less than 1.5. In an aspect, the atomic layer sheet further contains alkali metal ions, and has a molar ratio of alkali metal ion to boron (alkali metal ion/boron) of less than 1. The specification of these values is based on the case where the atomic layer sheet is an oxidation product of $MBH_4$, where M represents an alkali metal ion, and takes account of the fact that conventional boric acid has only boron-oxygen bonds and, when turned to a high molecule (polymerized), becomes three-dimensional and does not become an atomic layer sheet. The molar ratio between oxygen and boron (oxygen/boron) may be less than or equal to 1.2, less than or equal to 1.0, or less than or equal to 0.8. It may be more than or equal to 0.1, or more than or equal to 0.3. The molar ratio between alkali metal ion and boron (alkali metal ion/boron) may be less than or equal to 0.8, less than or equal to 0.6, or less than or equal to 0.4. It may be more than or equal to 0.01, more than or equal to 0.05, or more than or equal to 0.1.

An atomic layer sheet having a framework composition of $B_5O_3$ will now be described as an example of the atomic layer sheet of the present invention described above.

<Atomic Layer Sheet Having Composition of $B_5O_3$>

In the above, the "framework" of the atomic layer sheet is a part having a regular structure like those shown in FIGS. 2B and 2C and FIGS. 3A and 3C having the composition of $B_5O_3$, and occupies mainly the sheet portion other than terminal parts or deficient parts.

The atomic layer sheet has a framework composition of $B_5O_3$. As shown in FIGS. 2B and 2C and FIGS. 3A and 3C, the atomic layer sheet is an atomic layer consisting of boron and oxygen, and forms a two-dimensionally spread plane, while boron atoms bonded to oxygen atoms are bonded so as to form a distorted hexagon.

Boron atoms are categorized into those occupying the vertices of a hexagon and those occupying the sides of the hexagon in a unit structure of the crystal. Those occupying the sides of the hexagon are located alternately on the inside and outside of the sides. Thus, the framework has three-fold symmetry of boron-boron bonds.

Figure 2C:
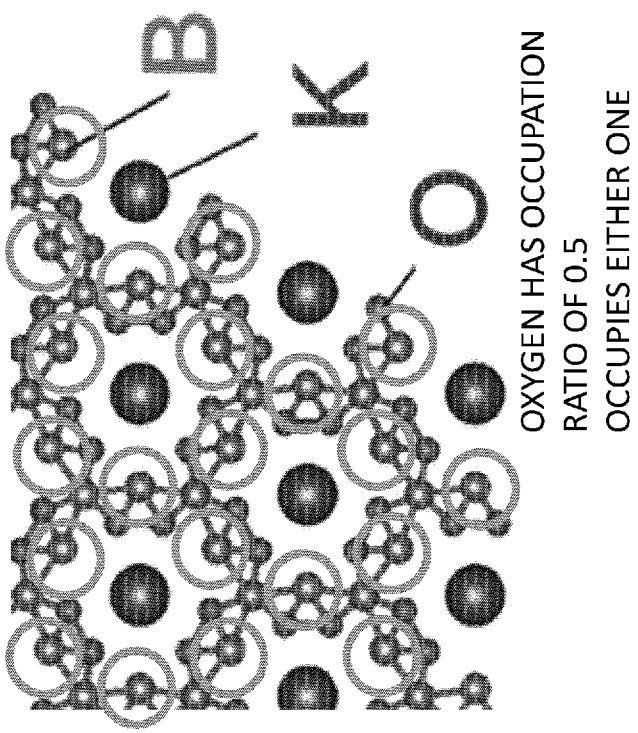

An oxygen atom occupies one place out of two places based on adjacent two boron atoms among the three boron atoms on each boron-atom-based side of the hexagon (although FIGS. 2B and 2C and FIGS. 3A and 3C show oxygen atoms in both two places for the sake of convenience, the occupation ratio of oxygen is 0.5 as described in FIG. 2C.

The bond distance of boron-boron is between 1.6 Å and 1.9 Å, and a value obtained by X-ray structure analysis is 1.784 Å. The bond distance is a value close to the average value of the distances of two kinds of boron-boron bonds present in borophene, and is a value between a value reported as a single bond and a value reported as oxygen crosslinking.

With regard to the bond distance of boron-oxygen, values obtained by X-ray structure analysis are 1.339 Å for the boron atom located on the side of the hexagon and 1.420 Å for the boron atom located at the vertex of the hexagon.

The atomic layer sheet contains a constituent X that is the framework part and a constituent Y other than the constituent X. In a typical aspect, the constituent Y is a terminal part and/or a deficient part.

In a typical aspect, the constituent Y is a boron oxide part containing B—OH. The constituent Y is a part of which the structure resembles trivalent $B_2O_3$ or $B(OH)_3$ (FIG. 3B), and is different from the framework part in the bonding state of B—O. Identification by the measurement of the boron layered crystal containing the atomic layer sheet provides the following.

In IR measurement (an infrared absorption spectrum), there are two kinds of peaks derived from B—O stretching at around 1300 to 1500 $cm^{-1}$ and a peak derived from BO—H stretching at around 3100 $cm^{-1}$. Of the two kinds of peaks derived from B—O stretching, the peak on the low wave number side corresponds to the constituent X. Specifically, of the peaks in the B—O region, the peak on the low wave number side (around 1350 $cm^{-1}$) corresponds to the boron sheet of the constituent X, and the peak on the high wave number side (around 1420 $cm^{-1}$), the position of which is close to the B—O stretching peak seen in $B(OH)_3$, corresponds to the constituent Y. Also the peak derived from BO—H stretching at around 3100 $cm^{-1}$ corresponds to the constituent Y.

In X-ray photoelectron spectrometry, there are peaks derived from the B-1s level at each of range of 190.5 to 193.0 eV and 192.5 to 194.0 eV. The peak at the range of 190.5 to 193.0 eV corresponds to the constituent X. Specifically, the peak corresponding to the constituent X is on the slightly lower energy side than the peak of $B_2O_3$ (193.3 eV), where boron is in a trivalent state; thus, complete oxidation up to a trivalent state has not been reached. The peak corresponding to the constituent X can be separated into two components; they correspond to two kinds of boron in the boron sheet of the constituent X, that is, the boron atom occupying the vertex of the hexagon in the unit structure of the crystal and the boron atom occupying the side of the hexagon. The peak at the range of 192.5 to 194.0 eV on the most oxidative side coincides with the peak of $B_2O_3$ having trivalent boron, and corresponds to the constituent Y.

In an ultraviolet-visible absorption spectrum, there is an absorption in the ultraviolet region of less than or equal to 250 nm; in a near-infrared absorption spectrum, there is an absorption including a band derived from the vibration structures of B—O and BO—H in the near-infrared region of 1000 to 2500 nm.

As above, in the atomic layer sheet, the constituent X that is the framework part has the composition of $B_5O_3$, and the constituent Y that is a boron oxide part containing B—OH has a structure resembling trivalent $B_2O_3$ and $B(OH)_3$. In the atomic layer sheet, the molar ratio between oxygen and boron (oxygen/boron) in the entire sheet containing these constituents X and Y is less than 1.5, and may be less than or equal to 1.2, or less than or equal to 1.0. It may be more than or equal to 0.6, or more than or equal to 0.7.

(Laminated Sheet)

The laminated sheet of the present invention contains a plurality of atomic layer sheets as described above and metal ions between atomic layer sheets. The atomic layer sheet is as described above; i.e., has boron and oxygen as framework elements, is networked by nonequilibrium couplings having boron-boron bonds, and has a molar ratio of oxygen to boron (oxygen/boron) of less than 1.5. A crystal of the present invention contains the laminated sheet.

In the laminated sheet of the present invention, examples of the metal ion between atomic layer sheets include an alkali metal ion, an alkaline-earth metal ion, and the like. Examples of the alkali metal ion include a lithium ion, a sodium ion, a potassium ion, a rubidium ion, a cesium ion, and the like. Examples of the alkaline-earth metal ion include a beryllium ion, a magnesium ion, a calcium ion, a strontium ion, a barium ion, and the like. Among these, an alkali metal ion, particularly a potassium ion is preferred.

The molar ratio between alkali metal ion and boron (alkali metal ion/boron) is less than 1.

Figure 2A:
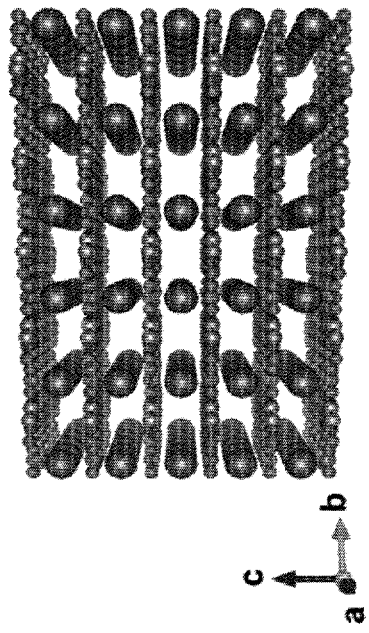

In the case of an atomic layer sheet having a framework composition of $B_5O_3$, FIG. 2A is seen as an example of the laminated sheet. The laminated sheet has a layered structure in which atomic layer containing boron and oxygen as main atoms and metal ions are alternately stacked. In a typical aspect, in the staking plane, the metal ion is located in the interior of the hexagon of boron atoms in the unit structure of the atomic layer sheet. The crystal is obtained as a rod-like single crystal by the manufacturing method described below. In a typical aspect including this acicular crystal, the extending direction of the crystal and the c-axis direction, which is the stacking direction, coincide, and atomic layer sheets are stacked along the extending direction. The interlayer bond of the laminated sheet (and the crystal) is weak, and the laminated sheet (and the crystal) can be easily cleaved in the direction perpendicular to the c-axis direction (the extending direction) by mechanically applied pressure. For example, by pressing an HOPG substrate against the crystal from above to cleave the crystal, a situation where nanosheets of crystal fragments attached to the surface can be observed.

(Method for Manufacturing Exfoliated Substance of Laminated Sheet)

The laminated sheet (and the crystal) of the present invention can be exfoliated by adding the laminated sheet and at least one selected from a crown ether and a cryptand into a solvent containing an organic solvent. Unlike graphite or the like, which is stacked by van der Waals forces, the laminated sheet of the present invention is stacked by ionic interaction between the anionic boron sheet and cationic metal ions; thus, the laminated sheet can be exfoliated while the sheet structure is held as it is by trapping interlayer metal ions with at least one selected from a crown ether and a cryptand and thereby dissolving out the metal ions to the organic solvent.

The exfoliated substance contains a single-layer atomic layer sheet. The solution obtained by the method mentioned above may, for example, be brought into contact with an HOPG substrate and the solvent may be removed, and thereby a crystal fragment attached to the HOPG surface can be observed as a single-layer sheet or a similar nanosheet.

In the method mentioned above, the organic solvent is not particularly limited, but preferably contains, for example, any of aprotic medium-polar solvents (nitriles such as acetonitrile and propionitrile, halogenated hydrocarbons such as dichloromethane, dichloroethanes, chloroform (trichloromethane), and carbon tetrachloride, ethers such as diethyl ether, tetrahydrofuran, 1,4-dioxane, ethylene glycol dimethyl ether, diethylene glycol dimethyl ether, and triethylene glycol dimethyl ether, ketones such as acetone, 2-butanone, methyl ethyl ketone, isobutyl methyl ketone, diisobutyl ketone, and cyclohexanone, esters such as ethyl acetate, butyl acetate, propylene glycol monomethyl ether acetate, methyl decanoate, methyl laurate, and diisobutyl adipate, and the like).

The organic solvent may also be a solvent in which any of these aprotic medium-polar solvents and a solvent compatible with these, such as any of aprotic highly polar solvents (N,N-dimethylformamide, N,N-dimethyl acetamide, dimethyl sulfoxide, sulfolane, dihexamethylphosphoric triamide, 1,3-dimethyl-2-imidazolidinone, N,N'-dimethylpropyleneurea, 1-methyl-2-pyrrolidinone, and the like), aprotic low polar solvents (aromatic hydrocarbons such as benzene, toluene, and xylenes, aliphatic hydrocarbons such as pentanes, hexanes, cyclohexane, octanes, and the like), and protic solvents (alcohols such as methanol, ethanol, 2-propanol, 1-butanol, 1,1-dimethyl-1-ethanol, hexanols, and decanols, carboxylic acids such as formic acid and acetic acid, nitromethane, and the like), are mixed together. Further, the solvent containing an organic solvent may also be one containing water.

In the method mentioned above, the crown ether is a macrocyclic ether represented by $(—CH_2—CH_2—O—)_n$, and its examples include 12-crown-4, 15-crown-5, 18-crown-6, dibenzo-18-crown-6, diaza-18-crown-6, and the like. The cryptand is a cage-shaped multidentate ligand comprising two or more rings, and examples include [2.2.2] cryptand and the like.

The addition amount of at least one selected from the crown ether and the cryptand is not particularly limited, but is preferably an excess amount against the laminated sheet.

The laminated sheet (and the crystal) of the present invention can be exfoliated also by dissolution in an aprotic highly polar solvent. The resulting solution may be brought into contact with an HOPG substrate and the solvent may be removed, and thereby a crystal fragment attached to the HOPG surface can be observed as a single-layer sheet or a similar nanosheet. Examples of the aprotic highly polar solvent include N,N-dimethylformamide, N,N-dimethylacetamide, dimethyl sulfoxide, sulfolane, dihexamethylphosphoric triamide, 1,3-dimethyl-2-imidazolidinone, N,N'-dimethylpropyleneurea, 1-methyl-2-pyrrolidinone, and the like.

(Method for Manufacturing Atomic Layer Sheet and Laminated Sheet)

An atomic layer sheet and/or a laminated sheet containing boron and oxygen according to the atomic layer sheet and the laminated sheet of the present invention can be manufactured by, for example, adding $MBH_4$, where M represents an alkali metal ion, into a solvent containing an organic solvent in an inert gas atmosphere to prepare a solution and exposing the solution to an atmosphere containing oxygen. A crystal of an atomic layer sheet or a laminated sheet can be grown in the step of exposure to an atmosphere containing oxygen.

Examples of the alkali metal ion M of $MBH_4$ include an alkali metal ion, an alkaline-earth metal ion, and the like. Among these, a potassium ion is one according to a preferred aspect.

The concentration of $MBH_4$ is not particularly limited, but is preferably 0.5 to 10 mM and more preferably 1 to 2 mM.

The inert gas is not particularly limited as long as it is one not having reactivity with $MBH_4$, and examples include rare gases such as argon, nitrogen, and the like. For example, in an environment in which oxygen in the air can be blocked, such as a glove box, the atmosphere is substituted with an inert gas not having reactivity with $MBH_4$, and $MBH_4$ is added into a solvent containing an organic solvent to prepare a solution.

The organic solvent is not particularly limited, but preferably contains, for examples, any of aprotic medium-polar solvents (nitriles such as acetonitrile and propionitrile, halogenated hydrocarbons such as dichloromethane, dichloroethanes, chloroform (trichloromethane), and carbon tetrachloride, ethers such as diethyl ether, tetrahydrofuran, 1,4-dioxane, ethylene glycol dimethyl ether, diethylene glycol dimethyl ether, and triethylene glycol dimethyl ether, ketones such as acetone, 2-butanone, methyl ethyl ketone, isobutyl methyl ketone, diisobutyl ketone, and cyclohexanone, esters such as ethyl acetate, butyl acetate, propylene glycol monomethyl ether acetate, methyl decanoate, methyl laurate, and diisobutyl adipate, and the like). In addition, the organic solvent may also be a solvent in which aprotic highly polar solvents (N,N-dimethylformamide, N,N-dimethylacetamide, dimethyl sulfoxide, sulfolane, dihexamethylphosphoric triamide, 1,3-dimethyl-2-imidazolidinone, N,N'-dimethylpropyleneurea, 1-methyl-2-pyrrolidinone, and the like), aprotic low polar solvents (aromatic hydrocarbons such as benzene, toluene, and xylenes, aliphatic hydrocarbons such as pentanes, hexanes, cyclohexane, octanes, and the like), or protic solvents (alcohols such as methanol, ethanol, 2-propanol, 1-butanol, 1,1-dimethyl-1-ethanol, hexanols, and decanols, carboxylic acids such as formic acid and acetic acid, nitromethane, and the like) compatible with the aprotic medium-polar solvents are mixed together with the aprotic medium-polar solvents. Further, the solvent containing an organic solvent may also be one containing water.

Exposure to the atmosphere containing oxygen is not particularly limited, but release in the air is one according to a preferred aspect.

After exposure to an atmosphere containing oxygen, heating may once be performed. The heating temperature is not particularly limited, but is preferably 30 to 40° C. The heating time is preferably 30 minutes to 2 hours.

After exposure to an atmosphere containing oxygen, the resulting product is preferably allowed to stand still in the same atmosphere. The temperature and time of exposure to an atmosphere containing oxygen are not particularly limited; however, in the case where the heating mentioned above is performed, thereafter the temperature is preferably set to room temperature (15 to 25° C.) and time is preferably set to 3 days to 1 month, in terms of sufficiently growing the crystal, etc.

The atomic layer sheet and laminated sheet of the present invention can be expected to be used for a thermotropic liquid crystal, which is product obtained by heating, and for various industries as well.

2. Thermotropic Liquid Crystal

A thermotropic liquid crystal of the present invention contains the atomic layer sheet described above. In a typical aspect, the thermotropic liquid crystal contains a laminated sheet incorporating metal ions between atomic layer sheets. Details regarding the atomic layer sheet, the laminated sheet, the metal ion, etc. in the thermotropic liquid crystal of the present invention are as described above, and a description thereof is omitted.

From SEM observation of a solidified sample produced by releasing to the air and still standing, it is presumed that, in the thermotropic liquid crystal of the present invention, sheet-like domains are orientated to form a vortex and boron sheets are oriented in a concentric circular configuration in the liquid crystal. From TEM observation, it is presumed that each sheet is a very thin sheet such as a single layer, two layers, or four to five layers.

In the thermotropic liquid crystal of the present invention, phase transition reversible with respect to temperature can be controlled between liquid crystal phase I with the high temperature and liquid crystal phase II with the low temperature. The transition between liquid crystal phases I and II is reversible with respect to temperature, and involves the endo- and exo-thermal processes. The temperature of the phase transition is not limitative; however, transition from liquid crystal phase II to liquid crystal phase I is, for example, seen around 145 to 155° C. during a heating process, and transition from liquid crystal phase I to liquid crystal phase II is, for example, seen at around 50 to 60° C. during a cooling process, while it can be a lower temperature in the case of passing through a supercooled state. It is presumed that liquid crystal phase II, in which interference colors are exhibited on the entire liquid crystal, is a state of a higher degree of orientation than liquid crystal phase I, in which interference colors are seen only in a peripheral portion of the liquid crystal. In the thermotropic liquid crystal of the present invention, both liquid crystal phase I and liquid crystal phase II exhibit interference colors like on a crystal under a polarizing microscope, while having fluidity like in a liquid.

The thermotropic liquid crystal of the present invention can be obtained by heating a crystal containing a laminated sheet incorporating metal ions between atomic layer sheets to more than or equal to 100° C. The heating temperature may be more than or equal to 105° C., more than or equal to 110° C., or more than or equal 120° C.; the upper limit is not particularly limited as long as it does not exceed the temperature at which the liquid crystal is pyrolyzed, and is, for example, less than or equal to 350° C.

The resulting liquid crystal is irreversible with respect to the heating temperature mentioned above. That is, once the crystal is increased in temperature to be changed to a liquid crystal, it does not transition to a crystal again but holds a liquid crystal state even when cooled. It is presumed that the orientation properties of the liquid crystal are produced from the high two-dimensional anisotropy of the boron sheet and the fluidity is exhibited by the weakness of the interlayer interaction.

The thermotropic liquid crystal of the present invention holds a liquid crystal state at least in the temperature region of −196 to 350° C. When the thermotropic liquid crystal is heated from room temperature, it stably exhibits interference colors of liquid crystal phase I up to 350° C.; when a cooling process up to −50° C. of liquid crystal phase II is measured by DSC in argon, no peak is observed on the low temperature side except for phase transition between liquid crystal phases I and II. From this fact, it is presumed that the point of transition from a liquid crystal to a crystal is present more on the low temperature side than −50° C. Even when the boron liquid crystal is further immersed in liquid nitrogen (−196° C.), no change is seen in liquid crystal texture.

When the thermotropic liquid crystal of the present invention is produced by heating a crystal to more than or equal to 100° C., the distance between atomic layer sheets is increased due to the heating. In the structure of a boron sheet in liquid crystal phase II, as shown in FIG. 6, the peaks of (001), (101), and (111) including components in the c-axis direction, which is the stacking direction, are shifted to a side of lower angles than those of the crystal before the heating; according to measurement results described later, the interplanar spacing of (001) indicating the interlayer spacing is 3.47 Å in the crystal state, whereas in liquid crystal phase II it is 3.54 Å and has expanded by approximately 0.1 Å. That is, liquid crystal phase II is a state where, while the orientation order in the in-plane direction of the boron sheet is held, only the orientation order in the stacking direction is expanded; it is presumed that the fluidity of the liquid crystal has occurred from such expansion in the interlayer direction.

In the thermotropic liquid crystal of the present invention, in the case where the framework composition of the atomic layer sheet is $B_5O_3$, the atomic layer sheet contains a constituent X that is the framework part and a constituent Y other than the constituent X. The constituent X is as described above, and a detailed description thereof is omitted.

The constituent Y is as follows. The change from a boron layered crystal to a boron liquid crystal by the heating at more than or equal to 100° C. mentioned above is not a thermal phase transition seen in common organic liquid crystals but a change involving chemical change. Specifically, the change involves dehydration condensation between bonds of B—OH in the terminal or deficient part of the boron sheet, as $B(OH)_3$ is condensated to $B_2O_3$. According to IR measurement, a peak derived from BO—H of the terminal part that has been seen at around 3100 $cm^{-1}$ in a boron layered crystal disappears after change to a liquid crystal. According to XPS measurement, the area of a peak corresponding to boron in a high oxidation state derived from the terminal or deficient part that has been seen in a crystal is relatively reduced as compared to a peak on the low energy side. $B(OH)_3$ is a molecule of a perfect planar structure, but takes on a three-dimensional tetrahedral structure by experiencing dehydration condensation to be changed to $B_2O_3$. Hence, it is presumed that also $B(OH)_x$ on a plane of the terminal or deficient part of the boron sheet experiences dehydration condensation with adjacent terminals in the sheet to bring about a three-dimensional structural change. It is presumed that, due to such change of the terminal or deficiency like breaking the stack of sheets, fluidity is produced between sheets and liquid crystallinity is exhibited. The reason why, once a boron layered crystal is liquid-crystallized, transition from the liquid crystal to a crystal is not seen even when cooling is performed is presumed to be that dehydration condensation between bonds of B—OH that creates a liquid crystal state is irreversible.

3. Lyotropic Liquid Crystal

A lyotropic liquid crystal of the present invention contains the atomic layer sheet described above. In a typical aspect, the lyotropic liquid crystal contains a laminated sheet incorporating metal ions between atomic layer sheets. Details regarding the atomic layer sheet, the laminated sheet, the metal ion, etc. in the lyotropic liquid crystal of the present invention are as described above, and a description thereof is omitted.

The lyotropic liquid crystal of the present invention is obtained by dissolving a crystal containing a laminated sheet in a solvent. For example, when dissolution in a solvent is performed and then the solvent is volatilized, the solution has fluidity and yet exhibits interference colors like on a crystal, and a hemispherical liquid crystal phase emerges. In this liquid crystal phase, interference colors are exhibited along a peripheral portion of a liquid drop; when this liquid crystal phase is observed with a polarizing microscope, dark color portions appear in perpendicular cross-like directions along the directions of the two polarizing plates, and these portions are presumed to be derived from the orientation of the boron sheet.

The lyotropic liquid crystal of the present invention can be prepared as a composition containing a solvent and a lyotropic liquid crystal existing in the solvent. The solvent is not particularly limited, but is preferably a solvent containing an organic solvent, particularly a solvent containing an aprotic highly polar solvent. Examples of the aprotic highly polar solvent include N,N-dimethylformamide, N,N-dimethylacetamide, dimethyl sulfoxide, sulfolane, dihexamethylphosphoric triamide, 1,3-dimethyl-2-imidazolidinone, N,N'-dimethylpropyleneurea, 1-methyl-2-pyrrolidinone, and the like. Among these, N,N-dimethylformamide is a preferred solvent.

In addition, the solvent is not particularly limited, but preferably an organic solvent, for examples, any of aprotic medium-polar solvents (nitriles such as acetonitrile and propionitrile, halogenated hydrocarbons such as dichloromethane, dichloroethanes, chloroform (trichloromethane), and carbon tetrachloride, ethers such as diethyl ether, tetrahydrofuran, 1,4-dioxane, ethylene glycol dimethyl ether, diethylene glycol dimethyl ether, and triethylene glycol dimethyl ether, ketones such as acetone, 2-butanone, methyl ethyl ketone, isobutyl methyl ketone, diisobutyl ketone, and cyclohexanone, esters such as ethyl acetate, butyl acetate, propylene glycol monomethyl ether acetate, methyl decanoate, methyl laurate, and diisobutyl adipate, and the like), aprotic low polar solvents (aromatic hydrocarbons such as benzene, toluene, and xylenes, aliphatic hydrocarbons such as pentanes, hexanes, cyclohexane, octanes, and the like), and protic solvents (alcohols such as methanol, ethanol, 2-propanol, 1-butanol, 1,1-dimethyl-1-ethanol, hexanols, and decanols, carboxylic acids such as formic acid and acetic acid, nitromethane, and the like), or water. These solvents are preferably used together with aprotic highly polar solvents, in a form compatible with them.

EXAMPLES

In the following, the present invention is described in still more detail using Examples; however, the present invention is not limited to these Examples.

1. Boron Layered Single Crystal 1-1. Synthesis of Crystal

In a glove box of an argon gas atmosphere, a MeOH solution of $KBH_4$ (5.0 mg/mL) was added into a solvent of $CHCl_3$:MeCN=1:1. The concentration of $KBH_4$ was set to 1.4 mM.

The resulting solution was released to the air, and was then heated at 40° C. for 1 hour. After that, the resulting product was allowed to stand still at room temperature for 2 weeks.

Figure 1B:
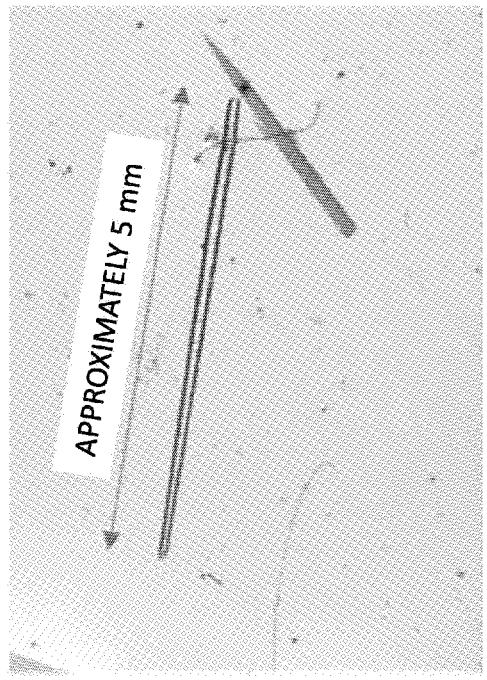

After the still standing, the production of an acicular crystal of approximately 2 cm at the longest was found (FIGS. 1A and 1B).

1-2. Single Crystal X-Ray Structure Analysis

Single crystal X-ray structure analysis of the resulting acicular crystal was performed.

Figure 2B:
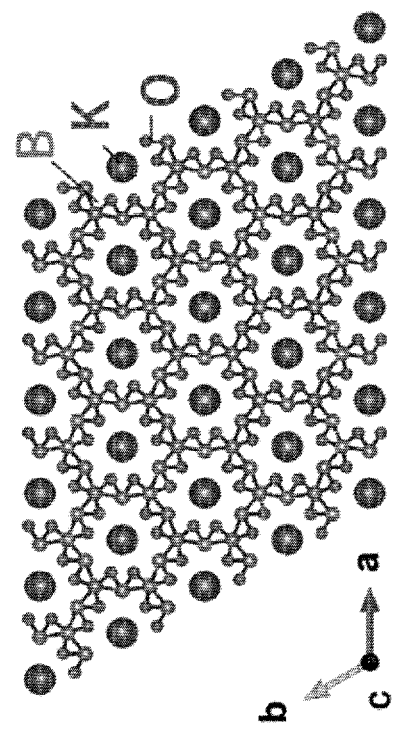

When single crystal XRD measurement was performed to analyze the structure, it has been found that a layered structure in which atomic layers consisting of boron and oxygen and potassium ions were alternately stacked was obtained FIG. 2A. It has been found that, in a layer of boron and oxygen, boron atoms bonded to oxygen were bonded to form distorted hexagons and thereby formed a two-dimensionally spread atomic layer sheet (FIGS. 2B and 2C). Further, it has been found that this boron atomic layer was a perfect atomic-plane without distortion.

Figure 3A:
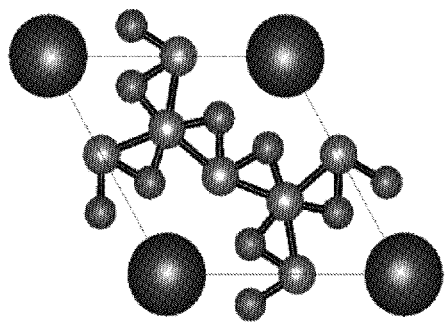
Figure 3B:
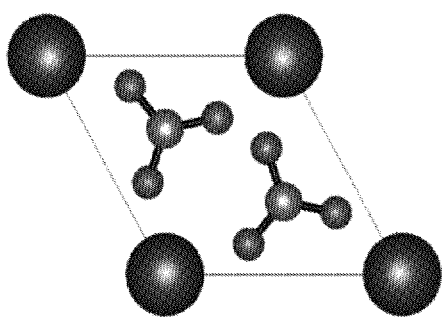

The occupation ratio of K is 1, that of B in the vertex portion of the hexagon is 1, that of B on the side of the hexagon is 0.635, and that of O is 0.5. It is presumed that 0 occupies one place out of two places on each side of the hexagon created by B (FIG. 2C). The composition was determined considering the fact that a terminal part is necessarily present in the boron sheet (FIGS. 3A and 3B described later).

Figure 3C:
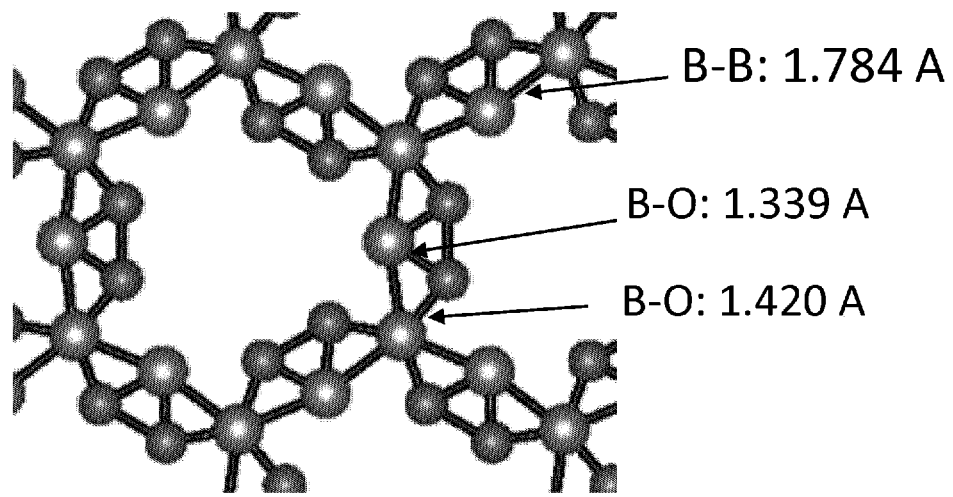

The bond distance of boron-boron of 1.784 Å is a value close to the average value of the distances of two kinds of boron-boron bonds present in borophene (1.876 Å and 1.614 Å). The bond distance of B-B in the crystal was a value between 1.61 Å of a single bond (Z. Anorg. Allg. Chem. 2017, 643, 517) and 1.824 Å of oxygen crosslinking (Inorg. Chem. 2015, 54, 2910) (FIG. 3C).

It is anticipated that the bonding state of B—O will be different between the boron sheet and the terminal or deficient part thereof thus, the investigation of bonding states in a boron layered crystal by IR measurement was attempted (FIGS. 4A and 4B). As a result, two kinds of peaks were obtained at around 1300 to 1500 $cm^{-1}$, where B—O stretching is seen (FIGS. 4A and 4B). Of these peaks in the B—O region, a broad peak on the high wave number side (1420 $cm^{-1}$) is similar in position to a B—O stretching peak seen in $B(OH)_3$; therefore, it is presumed that the peak on the high energy side out of the two kinds of peaks in the B—O region is derived from the terminal or deficient part, and the sharp peak on the low wave number side (1350 $cm^{-1}$) is derived from the boron sheet. Further, a peak derived from BO—H stretching was observed around 3100 $cm^{-1}$; therefore, it has been found that a B—OH bond is present in the terminal part. From the above facts, it has been suggested that a part resembling $B(OH)_3$ is present in the boron layered crystal, as the boron atomic layer sheet and the terminal or deficiency thereof.

1-3. Investigation of Oxidation State and Quantification of Terminal Part by XPS Measurement XPS measurement was performed to investigate the oxidation state of boron (FIGS. 5A to 5C). As a result of the measurement, in $KBH_4$ of a source material, a peak derived from B-1s emerges at 185.6 eV; in contrast, in the boron layered crystal, the peak top is shifted to the high energy side by approximately 6 eV, and the oxidation of boron associated with the production of a crystal has been suggested (FIGS. 5A and 5B). On the other hand, the peak top is a little more on the low energy side than the peak top of $B_2O_3$ (193.3 eV), where B is in a trivalent state; thus, it has been found that complete oxidation up to a trivalent state has not been reached (FIGS. 5A and 5B).

Further, it has been found that the broad peak of the obtained boron layered crystal can be separated into three components (FIG. 5A). As a result of the peak separation, it has been found that peak 3 most on the oxidation side coincides with that of $B_2O_3$ having trivalent boron, and peaks 1 and 2 are located more on the reduction side than peak 3. Hence, it is presumed that peak 3 corresponds to the terminal part resembling $B(OH)_3$, and peaks 1 and 2 correspond individually to two kinds of boron in the boron sheet. When the existence ratio between the boron sheet and the terminal part was calculated from the area ratio between these peaks, it has been found that it is 3.1:1.0 as the ratio in the unit cell.

Figure 6A:
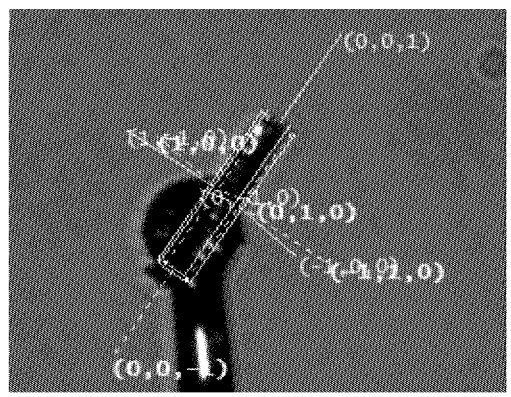
FIG. 6A shows plane indices analysis in X-ray single crystal structure analysis.
Figure 6B:
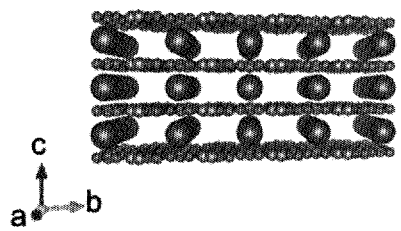
FIG. 6B shows a structure of the boron layered crystal.
Figure 6C:
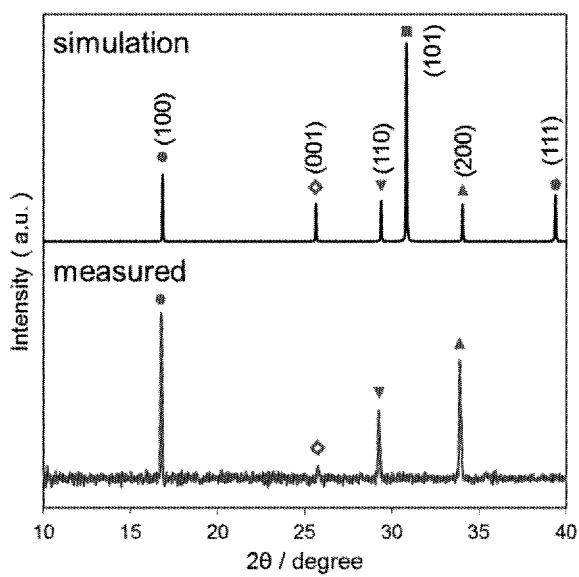
FIG. 6C shows XRD patterns of the boron layered crystal in a capillary.
Figure 6D:
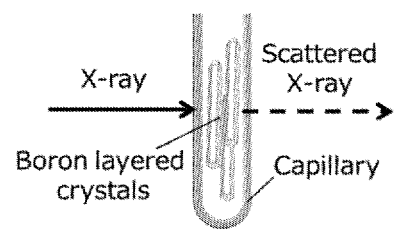
FIG. 6D shows a schematic of the measurement of XRD patterns.
Figure 6E:
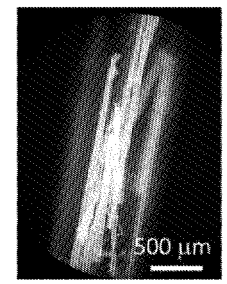
FIG. 6E shows a photograph of the boron layered crystal in the capillary.

When the assignment of plane indices of the boron layered crystal was performed from single crystal X-ray structure analysis, it has been found that the extending direction of the crystal and the c-axis direction, which is the stacking direction, coincide, and it has been found that boron atomic layers are stacked along the extending direction (FIGS. 6A and 6B).

The extending direction of the crystal can be found also from powder XRD measurement. The powder XRD measurement of the boron layered crystals in a capillary was performed, and comparison between the resulting diffraction pattern and a simulation of a diffraction pattern computed from the crystal structure was performed FIGS. 6C to 6E. The boron layered crystal is in a rod-like shape, and is therefore oriented in the capillary such that the extending direction of the crystal is parallel to the tube. Since X-rays were incident from directions perpendicular to the rotating capillary, it was anticipated that few diffracted rays in the extending direction of the crystal would be observed. As a result of the measurement, diffraction peaks of a plane including only a, b-axis components such as (100), (110), and (200) were observed at diffraction angles agreeing with the simulation; on the other hand, peaks including c-axis components hardly emerged, and only a very weak diffraction peak of (001), which is the interlayer spacing, was observed. From this fact, it has been found that the stacking direction coincides with the extending direction of the crystal, and it has been revealed that a rod-like crystal has been formed by the stacking of boron atomic layers.

1-4. Absorption Spectra of Boron Layered Crystal

Figure 7A:
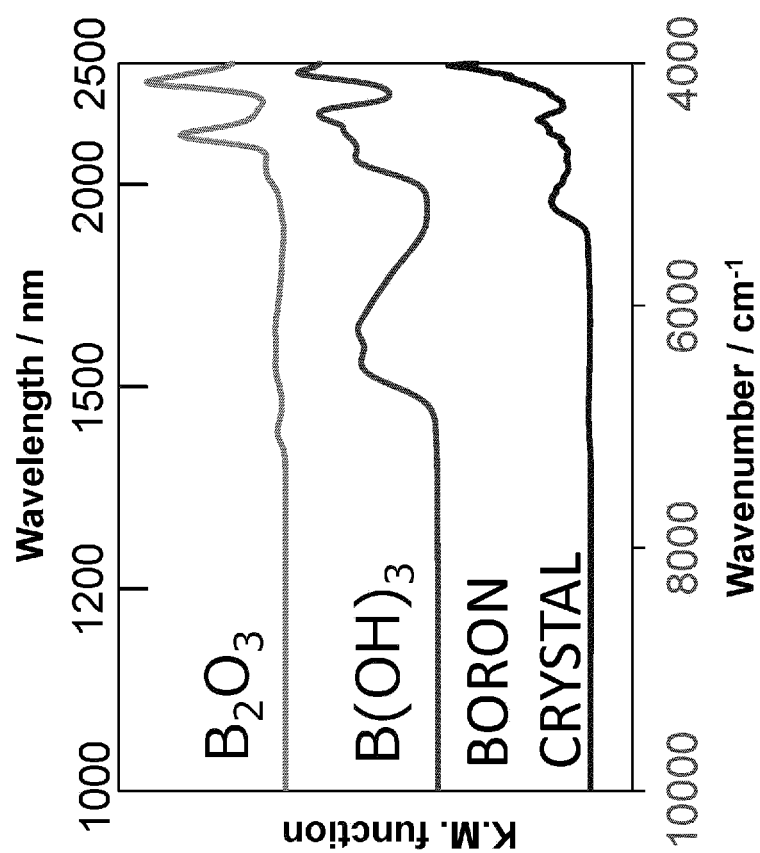
FIG. 7A denotes ultraviolet-visible absorption spectra of the boron layered crystal, $B(OH)_3$, and $B_2O_3$, and FIG. 7B denotes near-infrared absorption spectra of the boron layered crystal, $B(OH)_3$, and $B_2O_3$.
Figure 7B:
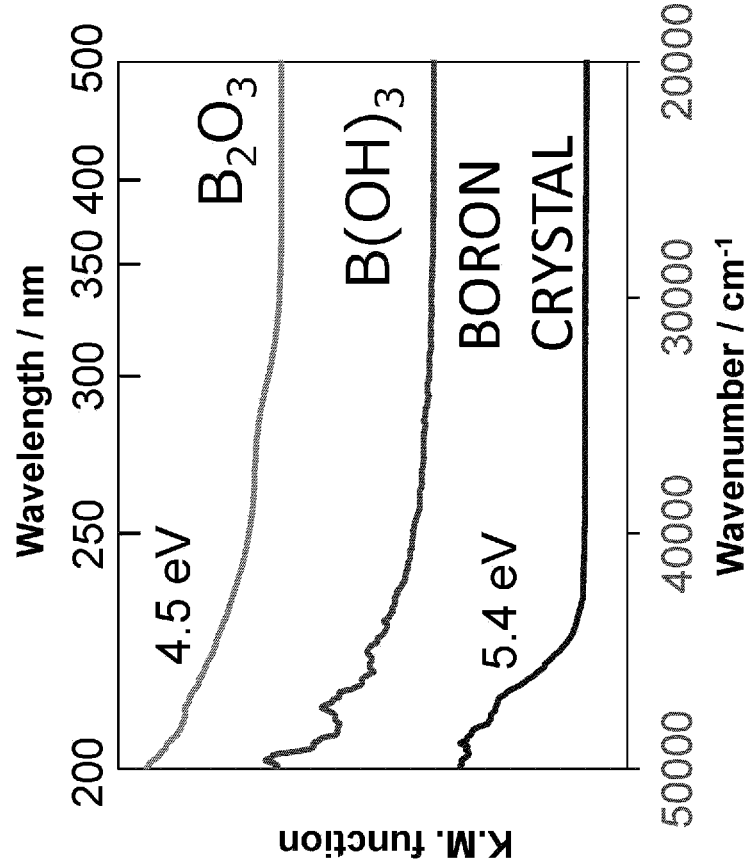

The measurement of an absorption spectrum of the boron layered crystal was performed (FIGS. 7A and 7B). The measurement of a diffuse reflection spectrum was performed in a crystal state by using a cell for solid diffuse reflection, and Kubelka-Munk transformation was performed; thus, an absorption spectrum was obtained. As a result of the measurement, absorption was observed in the ultraviolet region of less than or equal to 250 nm (FIG. 7A) When the band gap was calculated from the absorption edge, it has been found that the boron layered crystal is a semiconductor having a band gap of approximately 5.4 eV.

Further, as a result of spectrum measurement in a long wavelength region, it has been found that the boron layered crystal has absorption in the near-infrared region of 1000 to 2500 nm (4000 to 10000 cm$^{-1}$) (FIG. 7B). In the near-infrared region, absorption is seen also in $B_2O_3$ and $B(OH)_3$ at wavelengths different from those of the boron layered crystal; thus, it is presumed that these pieces of absorption are absorption derived from the vibration structures of B-0 and O—H.

Figure 8B:
FIGS. 8A and 8B denote SEM images of the boron layered crystal, and FIGS. 8C and 8D denote SEM images of nanosheets exfoliated from the boron layered crystal by mechanical pressure.
Figure 8D:
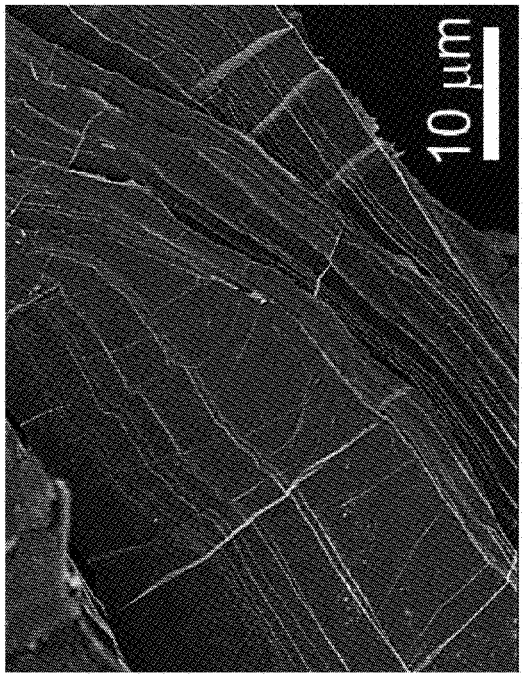
Figure 8A:
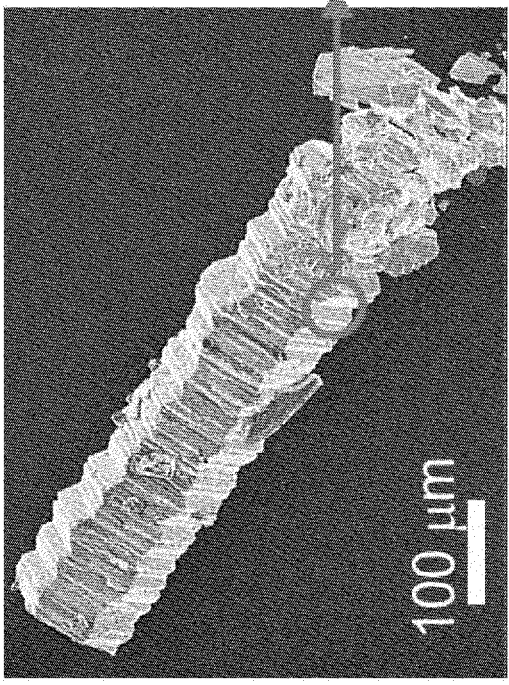

1-5. Shape Observation by SEM and Dynamical Characteristics of Boron Layered Crystal When FE-SEM observation was performed in order to examine the shape of the boron layered single crystal in more detail, it has been found that the crystal has a hexagonal columnar rod shape (FIGS. 8A and 8B). When the portion of a side surface of the rod is enlarged, a situation where a layered structure has grown along the extending direction of the crystal can be observed, and it has been found that a striped pattern of the single crystal is derived from the layered structure.

Figure 8C:
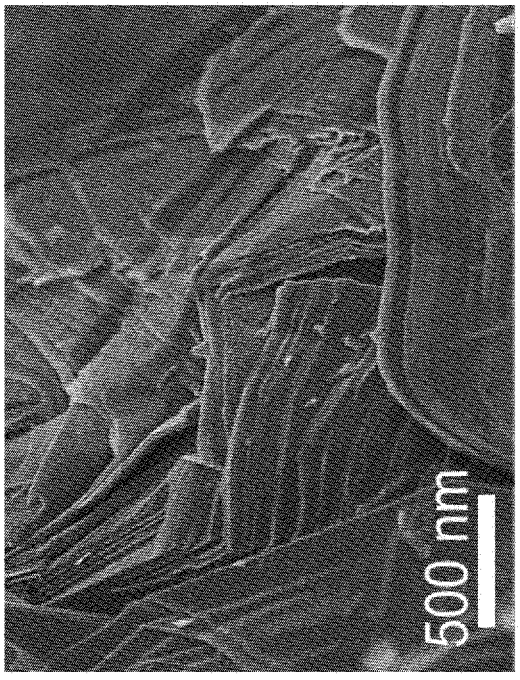

It has been found that the boron layered crystal can be easily cleaved in the direction perpendicular to the extending direction by mechanically applying pressure to the boron layered crystal with a spatula or the like. When the cleaved crystal was observed by SEM, partial production of nanosheets due to the collapse of the layer structure has been found (FIGS. 8C and 8D). Further, a very smooth surface of a nanosheet of the micron order has been seen in a part. From such ease of mechanical exfoliating, it has been suggested that the interlayer bond of the boron layered crystal is very weak.

1-6. Observation of Nanosheet by AFM

Figure 9B:
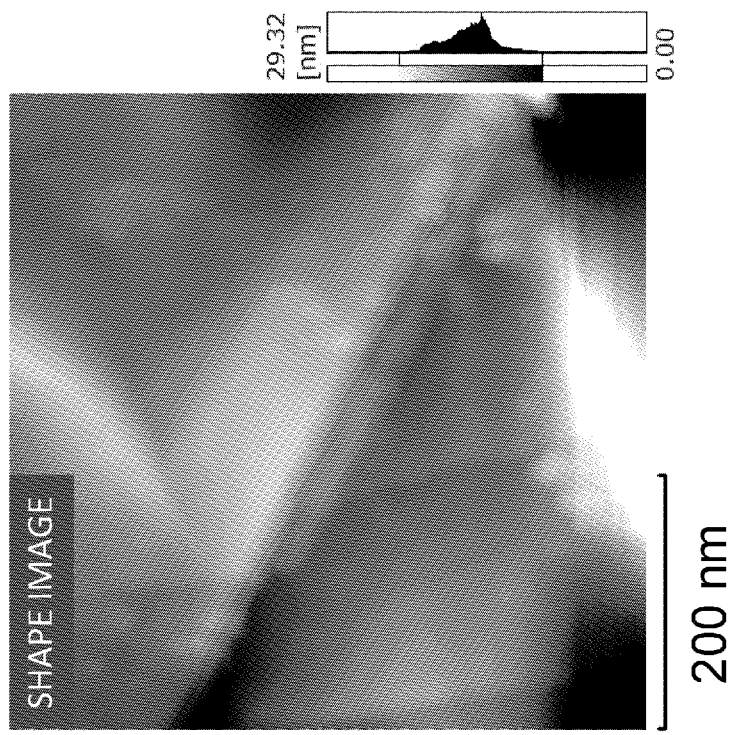
Figure 9A:
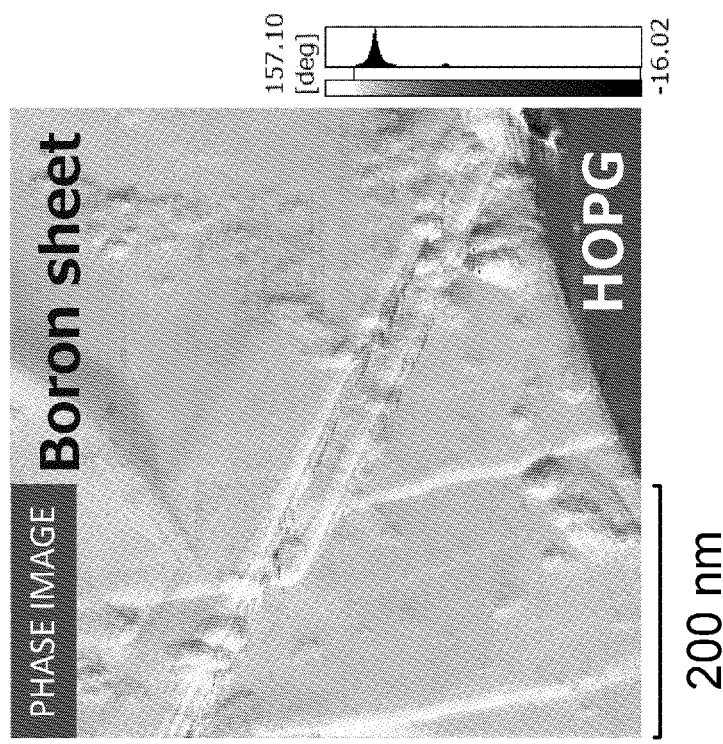

Since it has been revealed that a nanosheet is easily produced by mechanical exfoliating of the boron layered crystal, surface observation of a nanosheet by AFM was performed (FIGS. 9A and 9B and FIGS. 10A and 10B). The boron layered crystal was cleaved by pressing an HOPG substrate against the crystal from above, and a crystal fragment attached to the surface was directly observed by AFM (FIG. 9A). Although there were many portions where nanosheets were distorted and many portions that were not completely horizontal, a situation where almost horizontal nanosheets were piled up was observed in a part (FIG. 9B). Since the phase is clearly different between the sheet portion and the HOPG portion of the underlayer, the sheet portion was assessed as a boron sheet. When the height was actually measured for the sheet with the smallest thickness in the shape image, it has been found that, although unevenness has occurred because the sheet is not perfectly planar flat, the average is a thickness of approximately 2.0 nm (FIGS. 10A and 10B). From the above, it is presumed that these sheets are each a very thin sheet of approximately one to several layers. Thus, as a result of the AFM observation, a plurality of stacked sheets were found, and the observation of a single-layer sheet with a height of approximately 0.9 nm in the thinnest place succeeded. The height of the sheet is approximately 0.9 nm in the thinnest place, and correlates with the fact that the height of single-layer graphene based on AFM measurement is 0.8 nm (Science, 2004, 306, 666).

Next, the dissolution and the single-layering of the boron layered crystal with a crown ether and a cryptand were attempted. The crystals were dispersed in a solvent of $CHCl_3$:MeCN=1:1, and the boron layered single crystals were dissolved in 18-crown-6 or a cryptand in surplus. The solution was cast on an HOPG substrate, and cleaning was performed with chloroform to remove the surplus 18-crown-6 or cryptand. The observation of a single-layer sheet was attempted. In AFM, a crystal fragment attached to the surface was observed by AFM, and a nanosheet with a height of approximately 0.9 nm that appeared to be a single-layer sheet was observed on the HOPG substrate (FIG. 11; 18-crown-6 was used); also in STM, similarly the observation of a sheet with a height of approximately 0.7 nm succeeded. From these results, the accomplishment of single-layering of a boron layered crystal with a crown ether or the like has been suggested.

1-7. Observation of Nanosheet by TEM

Also the shape and surface observation of a nanosheet was performed by TEM observation. Similarly to the method for preparing an AFM sample, a micromesh-equipped TEM grid was pressed against the boron layered crystal from above to cleave the crystal, and a sheet attached to the grid surface was observed by TEM (FIGS. 12A to 12C: STEM images; FIGS. 12D to 12F and FIGS. 13A to 13C: high-resolution TEM images). As a result, a stacked structure of sheets and a nanosheet were directly observed in STEM (FIGS. 12A to 12C), and the observation of a very thin sheet with a weaker contrast than the mesh of the grid succeeded in high-resolution TEM (FIGS. 12D to 12F. It has been found that the thinnest sheet in the observed place has approximately 15 layers.

Also the observation of a lattice succeeded by high-magnification observation of these sheets (FIGS. 13A to 13C). Hexagonal diffraction patterns were obtained from some sheet surfaces, and the same hexagonal symmetry as a boron sheet was observed. In a part, also a lattice with a spacing of 0.343 nm was observed. This coincides with the interlayer spacing of the boron layered crystal of 0.347 nm; thus, it has been found that a stack of atomic layers has been actually measured. From these facts, it has been proven that a very thin nanosheet can be exfoliated by mechanical pressure, and it has been shown that the interlayer interaction of the boron layered crystal is weak.

2. Liquid Crystallization by Heat of Boron Layered Crystal and Characteristics Thereof 2-1. Liquid Crystallization by Heat of Boron Layered Crystal A change to the liquid crystal can be found by polarizing microscope observation. A state of having fluidity like in a liquid and yet exhibiting interference colors like on a crystal under a polarizing microscope is a liquid crystal. A crystal was vacuum-sealed in a capillary in order to block the influence of oxygen and water, and a heating stage-equipped polarizing microscope was used to observe change in form and interference colors in a temperature increase process.

When heating was slowly performed from 50° C. to 120° C. at a temperature increase rate of less than or equal to 5° C./min, an event where a rod-like boron layered crystal began to melt from around 105° C. and the form began to change to a liquid form was observed (FIG. 14A). Although the form is a liquid form, interference colors are seen in a peripheral portion of the liquid portion; thus, it has been found that the boron crystal is not a liquid but has been changed to a liquid crystal.

In addition, during cooling process to 35° C. at 5° C./min after heating to 120° C., it was observed that the liquid crystal gradually changed the form to a circular (FIG. 14B). Although interference colors were always exhibited in a peripheral portion, the shape changed fluidly; thus, it can be seen that a liquid crystal state is held even in the cooling process. From this fact, it has been found that, once the crystal is increased in temperature to be changed to a liquid crystal, it does not transition to a crystal again but holds a liquid crystal state even when cooled up to 35° C. It is presumed that the orientation properties of the liquid crystal are produced from the strong two-dimensional anisotropy of the boron sheet and the fluidity is exhibited by the weakness of the interlayer bond. The reason why a cross-like dark color portion is seen in a peripheral portion is that the optical axes of liquid crystal domains are oriented along the directions of the orthogonal polarizing plates and are transmitted as they are without interfering with polarized light. Thus, it is presumed that boron sheets are oriented in a concentric circular configuration in the liquid crystal.

Figure 15C:
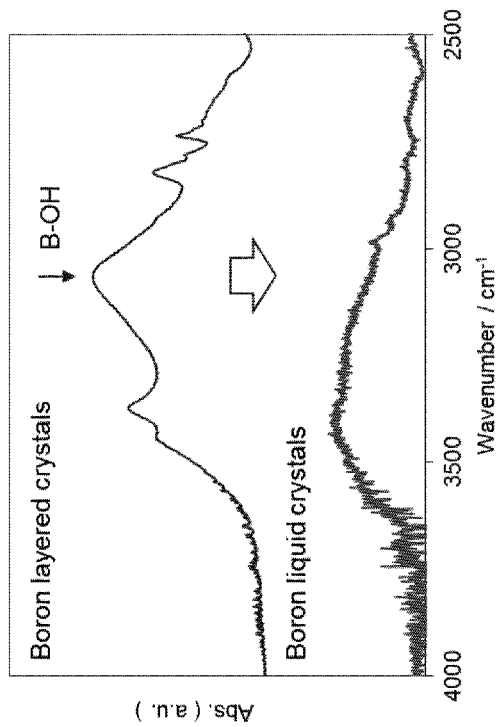
FIG. 15A denotes a TG curve of the boron layered crystal, FIG. 15B denotes a TG curve of $B(OH)_3$, and FIG. 15C denotes IR spectra of the boron layered crystal and the boron liquid crystal.
Figure 15A:
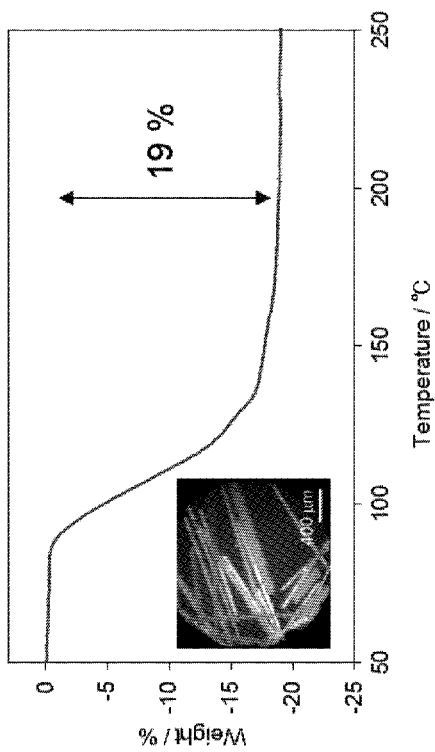
Figure 15B:
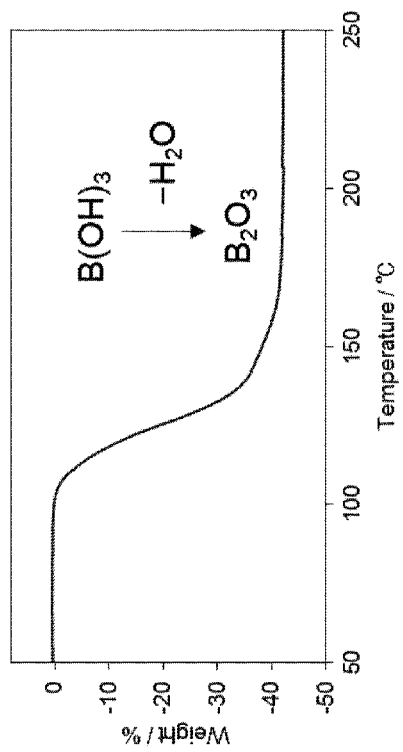

The observation by thermal analysis of change from the boron layered crystal to the boron liquid crystal was attempted. When TG measurement of the boron layered crystal was performed in argon, a weight decrease of approximately 19% was observed at around approximately 100 to 120° C., at which a change to a liquid crystal was found in polarizing microscope observation (FIG. 15A). From this fact, it has been revealed that the change from the boron layered crystal to the boron liquid crystal is not a thermal phase transition seen in common organic liquid crystals but a change involving chemical change. Further, the temperature of the weight decrease is close to the temperature at which $B(OH)_3$ experiences dehydration condensation to be changed to $B_2O_3$ (FIG. 15B); thus, it has been suggested that the change from a crystal to a liquid crystal involves dehydration condensation between bonds of B—OH in the terminal or deficient part of the boron sheet.

The observation of BO—H stretching was attempted by IR measurement in order to find whether dehydration condensation between bonds of B—OH in the terminal or deficient part of the boron sheet had progressed with transition from a crystal to a liquid crystal or not. When vacuum heating was performed at approximately 120° C. to make a change to a liquid crystal and then measurement was performed, it has been found that a peak derived from BO—H in the terminal part that has been seen at around 3100 $cm^{-1}$ in the boron layered crystal disappears after the change to the liquid crystal (FIG. 15C). From this fact, it has been shown that dehydration condensation has progressed between bonds of B—OH in the terminal or deficient part in association with the change from the boron layered crystal to the boron liquid crystal.

Figure 16A:
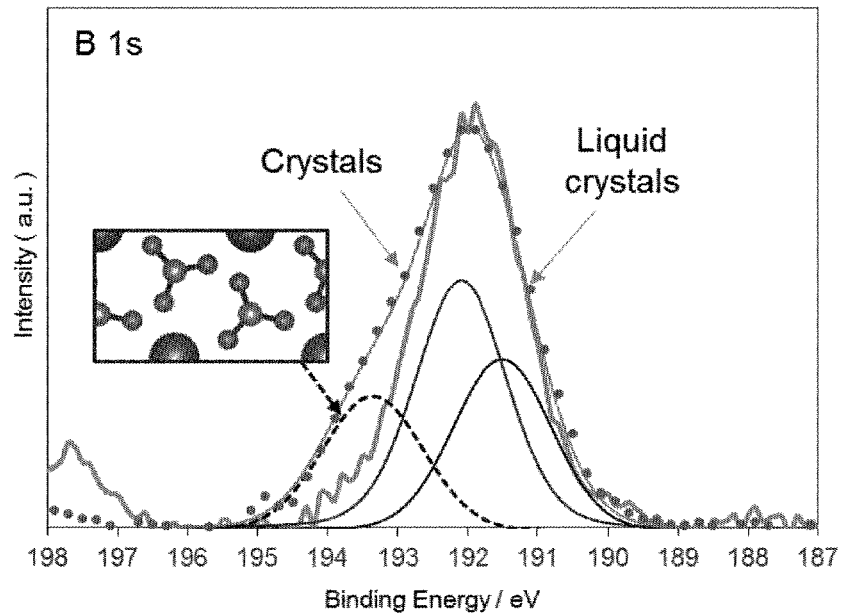
FIG. 16A shows XPS spectra of the boron layered crystal and the boron liquid crystal.

Further, a comparison of the oxidation state of boron between before and after liquid crystallization was performed by XPS measurement. The boron crystal was liquid-crystallized on an HOPG substrate, and measurement was performed. As a result, it has been found that the area of a peak corresponding to boron in a high oxidation state derived from the terminal or deficient part that has been seen in the crystal is relatively reduced as compared to a peak on the low energy side (FIG. 16A). Also from this fact, it has been found that the liquid crystallization process involves a structural change of the $B(OH)_3$ part in the terminal or deficient part.

Figures 16B, 16C, 16D:
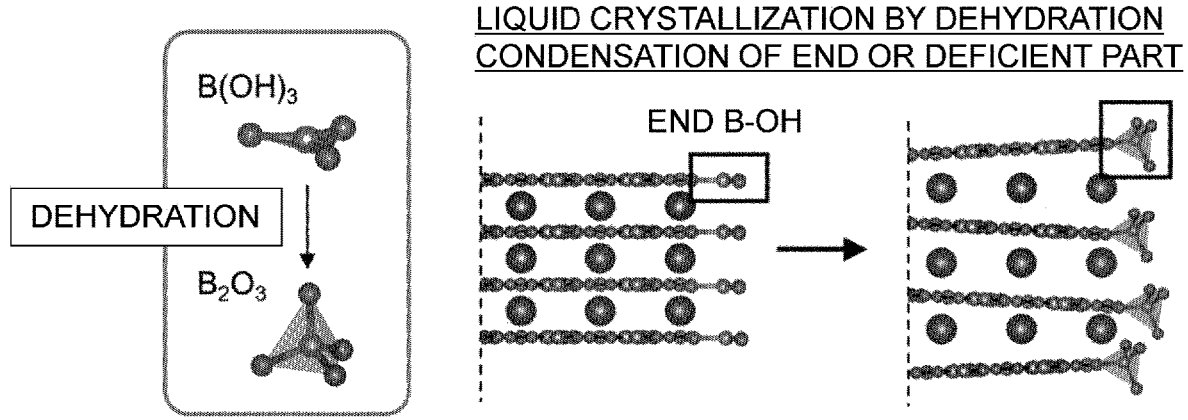
FIGS. 16B to 16D show a possible mechanism of change from the crystal to the liquid crystal.

The mechanism of liquid crystal formation was considered from the fact that liquid crystallization occurs according to dehydration condensation between bonds of B—OH in the terminal or deficient part of the boron sheet. $B(OH)_3$ is a molecule of a perfect planar structure, but takes on a three-dimensional tetrahedral structure by experiencing dehydration condensation to be changed to $B_2O_3$. Hence, it is presumed that also $B(OH)_x$ on a plane of the terminal or deficient part of the boron sheet experiences dehydration condensation with adjacent terminals in the sheet to bring about a three-dimensional structural change. It is presumed that, due to such change of the terminal or deficiency like breaking the stack of sheets, fluidity is produced between sheets and liquid crystallinity is exhibited (FIGS. 16B to 16C). The reason why, once the boron layered crystal is liquid-crystallized, transition from the liquid crystal to a crystal is not seen even when cooling is performed up to 35° C. is presumed to be that dehydration condensation between bonds of B—OH that creates a liquid crystal state is irreversible.

Figure 17A:
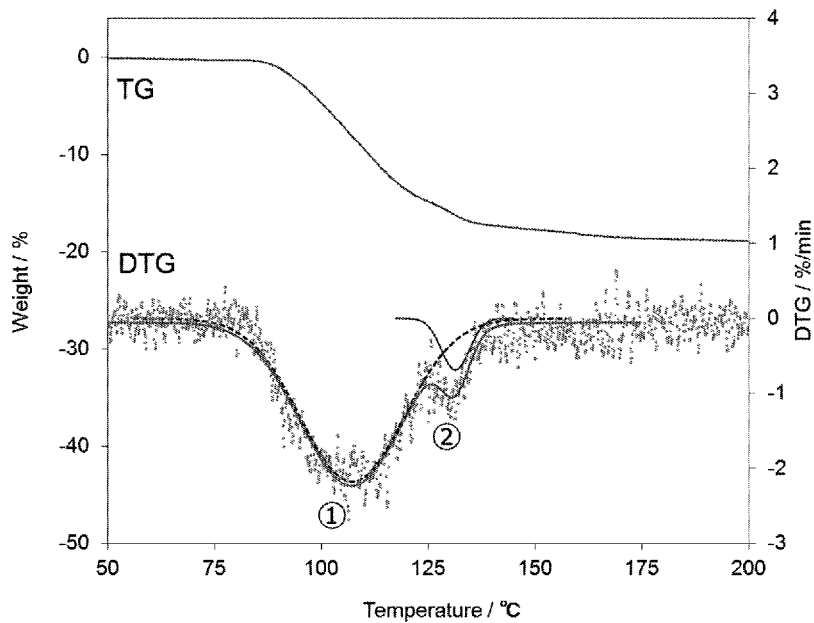
FIG. 17A denotes a TG curve and a DTG curve of the boron layered crystal, and FIG. 17B denotes DSC curves of the boron crystal in argon and the boron crystal in a vacuum atmosphere (in a capillary).

The weight decrease of approximately 19% at around the liquid crystallization temperature seen in TG measurement is a value 5 times or more that obtained on the assumption that the entity of the terminal or deficient part of the boron sheet has experienced dehydration condensation. Further, it can be seen that the decrease has begun from the low temperature side as compared to the dehydration temperature of $B(OH)_3$. In order to elucidate this weight decrease, a differential curve was created for the weight decrease around 100° C. of TG; as a result, it has been found that the weight decrease can be separated into two-step weight decreases of a broad decrease starting from around 75° C. and a sharp decrease at around 125° C. (FIG. 17A). It is the decrease on the high temperature side that corresponds to the dehydration condensation temperature of $B(OH)_3$; thus, it is presumed that the decrease of approximately 3% on the high temperature side corresponds to dehydration condensation between bonds of B—OH in the terminal part of the boron sheet and that the decrease of approximately 16% on the low temperature side is derived from the desorption of an adsorbed solvent such as $H_2O$.

Figure 17B:
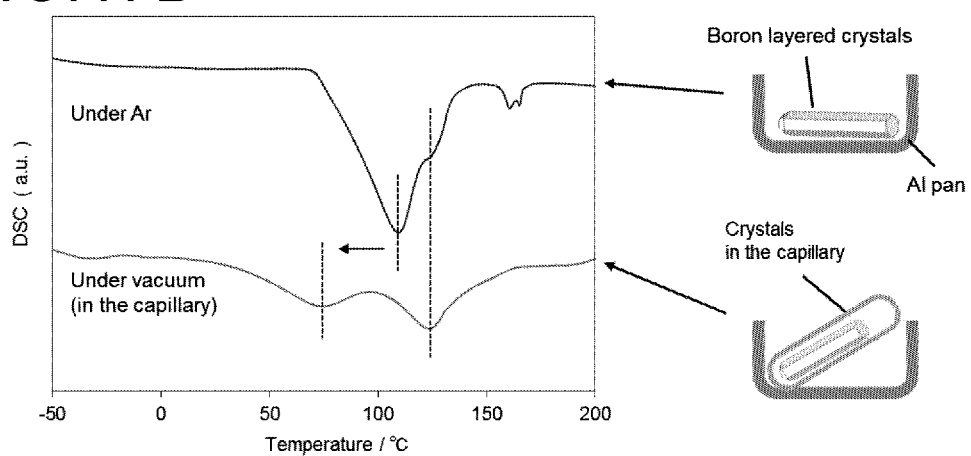

Also the measurement of a heat flow rate around the liquid crystallization temperature by DSC measurement was performed. A crystal was placed directly on an Al pan, and measurement was performed in argon; as a result, around the liquid crystallization temperature in the first temperature increase process, two endothermic peaks were observed to overlap at around approximately 110° C. and approximately 125° C. (FIG. 17B). In contrast, when a capillary containing a crystal was placed on an Al pan while the crystal was vacuum-sealed and measurement was performed, likewise two endothermic peaks were obtained, but the peak on the low temperature side experienced an intensity decrease and furthermore experienced a shift to a lower temperature around 75° C., while no change in position was seen in the peak at 125° C. on the high temperature side. From this fact, it has been suggested that the peak on the high temperature side, which is not changed in temperature even in a vacuum, corresponds to dehydration condensation between bonds of B—OH at the terminal of the sheet and that the peak on the low temperature side, which has experienced an intensity decrease in a vacuum and has experienced a shift to a lower temperature, is derived from the desorption of adsorbed water.

Figure 18A:
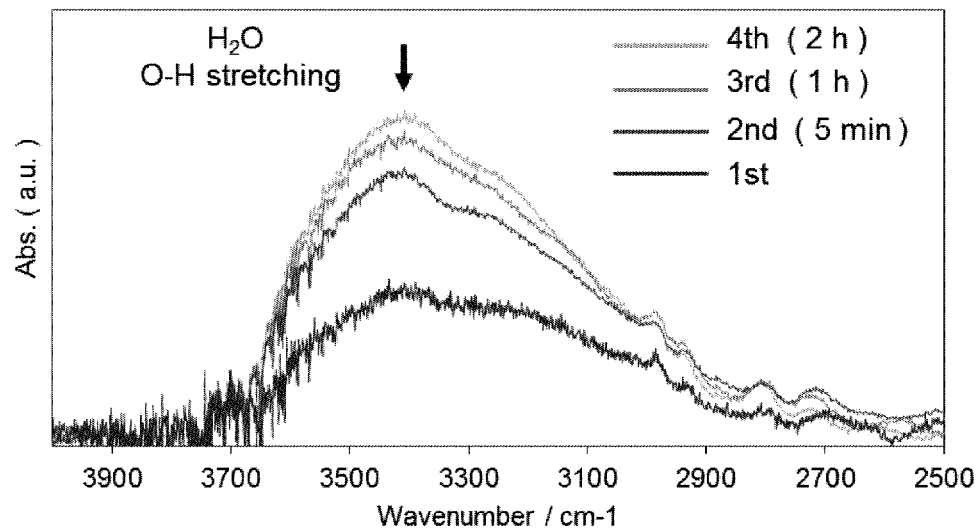
FIG. 18A denotes changes of an IR spectrum of the boron liquid crystal within 2 hours, and FIG. 18B denotes TG-DTA curves of the boron liquid crystal during a cooling process in the air.

From the results of DTG and DSC measurement, it has been suggested that the boron crystal and the liquid crystal have hygroscopicity; hence, water adsorption was monitored from IR and TG-DTA. The boron layered crystal was vacuum-heated at approximately 150° C. to be liquid-crystallized, and IR with the lapse of time after release to the air was measured. As a result, an event where the intensity of a peak derived from O—H stretching of $H_2O$ of approximately 3400 cm' increased with the lapse of time, namely, 5 minutes, 1 hour, and 2 hours from the first round of measurement after liquid crystallization, was observed (FIG. 18A). From this fact, it has been shown that the boron liquid crystal has hygroscopicity.

Figure 18B:
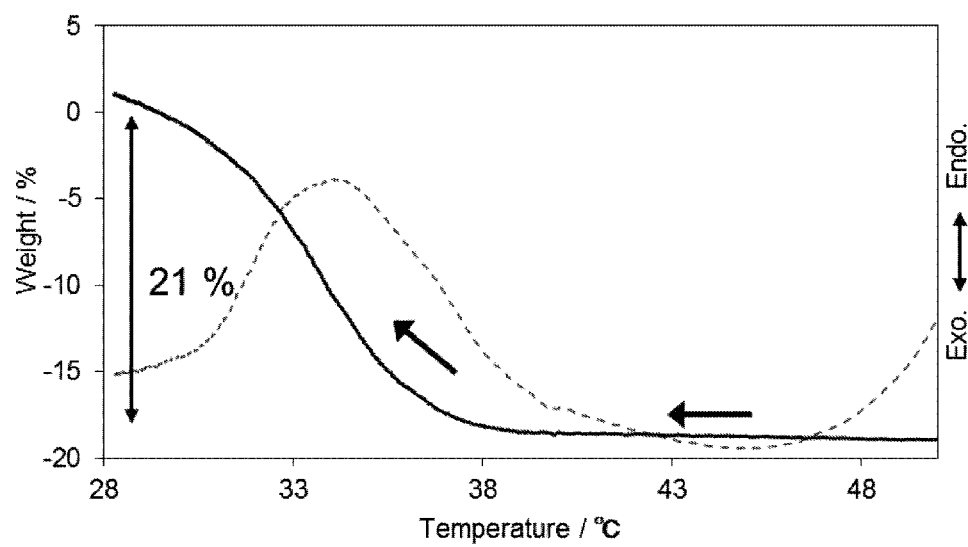
Figure 19A:
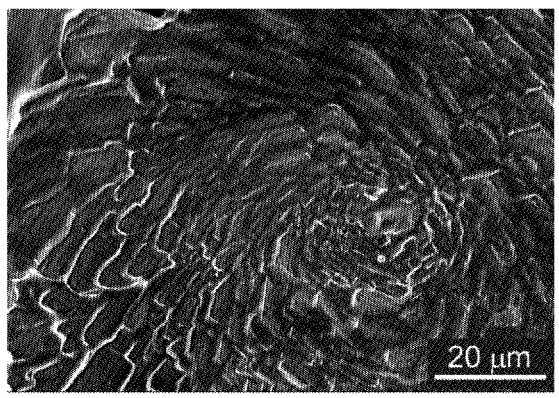
FIGS. 19A, 19B and 19D denote SEM images of the boron liquid crystal after solidification, and FIG. 19C denotes a schematic of the boron liquid crystal after solidification.
Figure 19B:
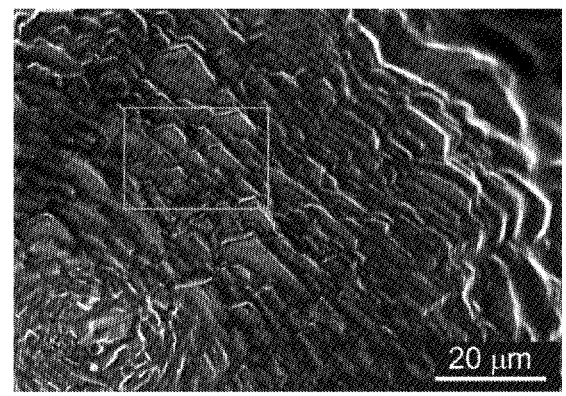
Figure 19C:
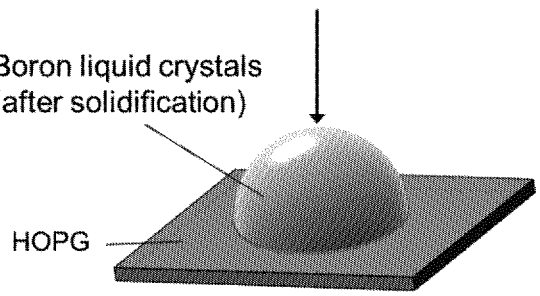
Figure 19D:
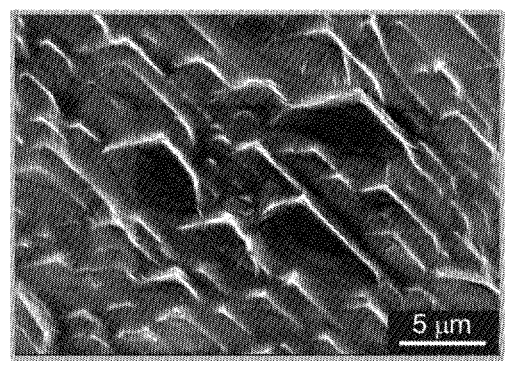
Figure 20A:
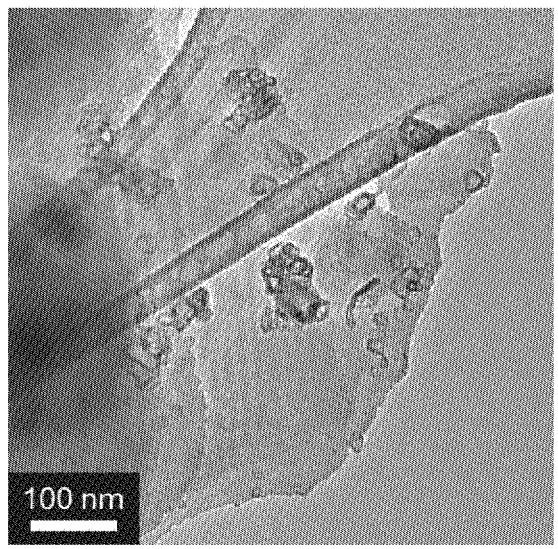
FIGS. 20A and 20B denote TEM images of nanosheets of the boron liquid crystal and FIGS. 20C to 20E denote lattice patterns of nanosheets.
Figure 20B:
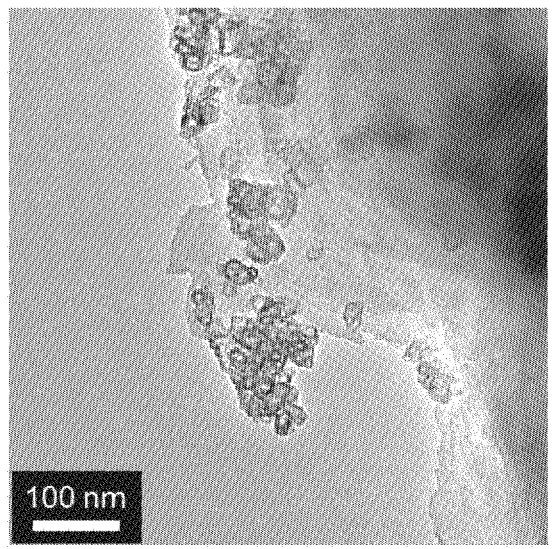
Figure 20C:
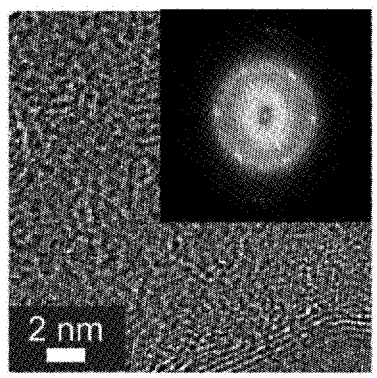
Figure 20D:
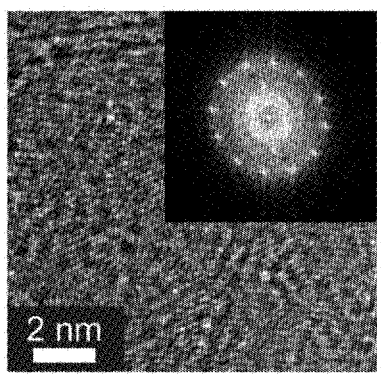
Figure 20E:
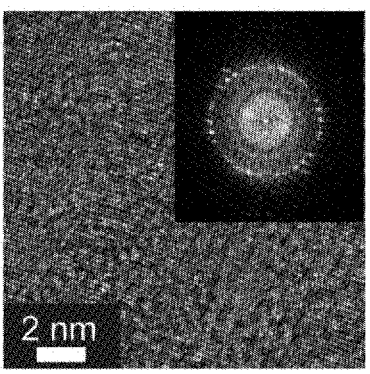

Further, mass change after liquid crystallization and release to the air was measured by TG-DTA in order to measure the amount of water adsorbed on the liquid crystal. As a result, a mass increase of approximately 21% was observed from less than or equal to approximately 40° C. (FIG. 18B). In view of the result of IR measurement as well, it can be seen that the mass increase corresponds to the adsorption of $H_2O$. Further, it can be seen that the adsorption amount almost coincides also with the weight decrease in the crystal. From the above, it has been suggested that the boron liquid crystal has hygroscopicity and that the first step of weight decrease in TG measurement seen in the above corresponds to the desorption of adsorbed water, and it has been found that the second step corresponds to dehydration condensation between bonds of B—OH.

2-2. SEM and TEM Observation

When the boron liquid crystal is observed with a polarizing microscope, it appears to be a liquid drop exhibiting interference colors particularly strongly in a peripheral portion. The observation of the liquid crystal structure and domains was attempted by observing this liquid crystal by SEM. However, as a result of the SEM observation, although the observation of a hemispherical liquid crystal succeeded, direct observation of domains and the structure was impossible because the interior of the liquid crystal vigorously moved due to its fluidity. Further, the liquid crystal was not solidified even when irradiated with an electron beam for a long time.

On the other hand, it has been found that the boron liquid crystal can stably hold a liquid crystal phase in a vacuum, but is solidified by release to the air. It is presumed that this is due to a change of the structure because of oxidation or water, etc. Since direct observation in a liquid crystal state was impossible, shape observation after solidification was performed.

The boron crystal was liquid-crystallized on HOPG, was solidified by release to the air one night, and was then observed by SEM. As a result, a situation where plate-like domains were oriented to form a vortex was observed (FIGS. 19A to 19D). Plate-like domains on the inner side stand more, and those on the outer side are more in a lying state. When the image is locally enlarged, also a situation where plate-like flakes were mutually oriented in one direction was observed. From this fact, it is presumed that the liquid crystal was solidified while holding the orientation in the liquid crystal state. Further, it is presumed that the plate-like flake is formed of a boron sheet.

Further, TEM measurement was performed in order to observe a finer shape. The crystal was vacuum-heated on a grid to be liquid-crystallized, was allowed to stand in the air for several days to be solidified, and was then observed. As a result, a sheet with a very thin contrast similar to that when the boron crystal was exfoliated was observed (FIGS. 20A to 20E). Further, also the observation of a lattice of the surface of this sheet succeeded, and hexagonal diffraction spots with a lattice spacing of 0.20 nm were observed. This agrees with the symmetry in the in-plane direction of a boron sheet, and agrees also with the spacing between (200) planes (0.20 nm); hence, it is presumed that a boron sheet is directly observed. From this fact, it has been shown that the sheet structure is held even after liquid crystallization. Further, it has been found that 1 set, 2 sets, and 4 to 5 sets of hexagonal diffraction spots are present in different observed sheets. This is a phenomenon seen in graphene, and it is presumed that the pile of sheets is shifted between layers and consequently the number of stacked sheets has appeared in diffraction spots in agreement with the number of hexagonal sets. From this fact, it has been found that the sheets of which the lattices were observed are each a very thin sheet such as a single layer, 2 layers, or 4 to 5 layers.

2-3. Thermotropic Characteristics of Boron Inorganic Liquid Crystal

Figure 21:
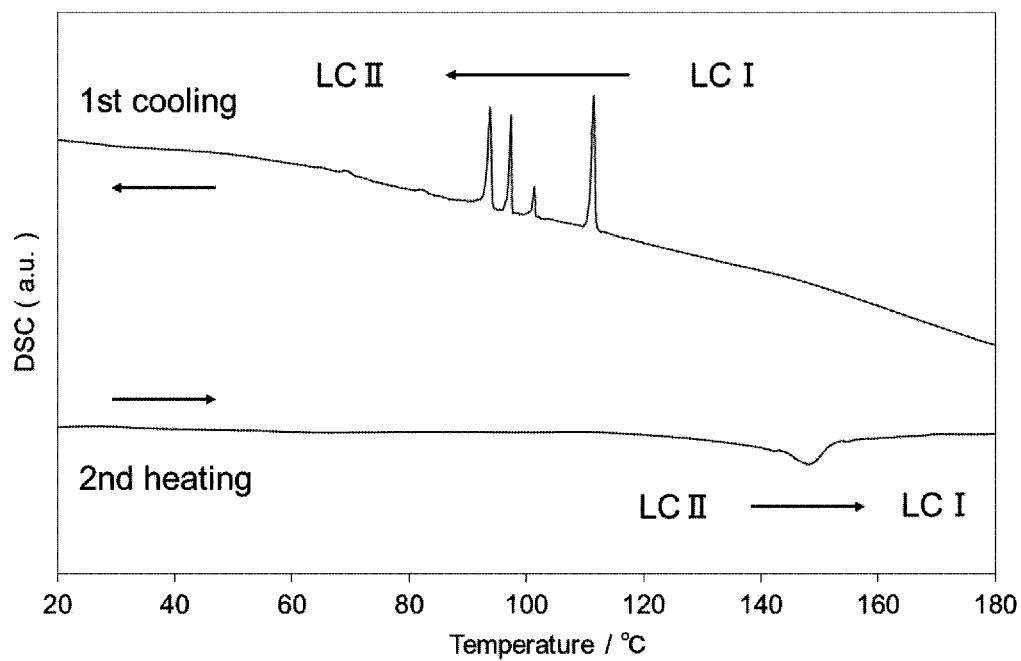
FIG. 21 denotes DSC curves of the boron crystal in a vacuum in a glass capillary.

The phase transition behavior between two liquid crystal phases of the boron liquid crystal was found successfully by DSC. Each of the rates of cooling and temperature increase was set to 5° C./min, and DSC measurement of the boron liquid crystal vacuum-sealed in a capillary was performed; as a result, sharp exothermic peaks derived from transition from liquid crystal phase I to liquid crystal phase II were obtained in the first cooling process (FIG. 21). Further, in the second temperature increase process, a broad endothermic peak derived from transition from liquid crystal phase II to liquid crystal phase I was obtained at approximately 150° C. The reason why the exothermic peaks in the cooling process are sharper and present more on the low temperature side than the endothermic peak in the temperature increase process is presumed to be that the transition from liquid crystal phase I to II passes through supercooled states. From the above, in the boron liquid crystal, a phase transition behavior due to heat was observed between liquid crystal phases I and II.

The transition between liquid crystal phases observed in DSC measurement can be observed with a polarizing microscope using a temperature changeable stage. When the crystal was vacuum-sealed in a capillary and was heated up to 200° C. while being observed with a polarizing microscope, a phenomenon of change to the liquid crystal phase I was seen (FIGS. 22A to 22D). This is the liquid crystal phase seen in the above in which interference colors are exhibited only in a peripheral portion. When a process in which this liquid crystal phase II was cooled at a rate of 10° C./min was observed, interference colors appeared over the entirety at approximately 57° C., and a transition to the liquid crystal phase II in which interference colors of gradated rainbow colors like those seen on organic liquid crystals were shown on the entire liquid crystal was observed. It is presumed that this phase transition behavior corresponds to the exothermic peaks observed in DSC. It is presumed that the liquid crystal phase II, in which interference colors are exhibited on the entire liquid crystal, is a state of a higher degree of orientation than the liquid crystal phase I, in which interference colors are seen only in a peripheral portion of the liquid crystal.

Further, the reversibility of the transition between liquid crystal phases was verified. After transition to the liquid crystal phase II, cooling was performed up to room temperature, and the temperature was increased again; as a result, it has been found that the interference colors of the liquid crystal phase II began to disappear at around approximately 140° C. and the liquid crystal transitioned to the liquid crystal phase I again (FIGS. 22E to 22J). It is presumed that this is a behavior corresponding to the endothermic peak in the temperature increase process of DSC. When this liquid crystal phase I was cooled again from 150° C., it has been found that the liquid crystal transitioned to the liquid crystal phase II again at around approximately 54° C. From these facts, it has been shown that the transition between the liquid crystal phases I and II is reversible with respect to temperature.

Figure 23A:
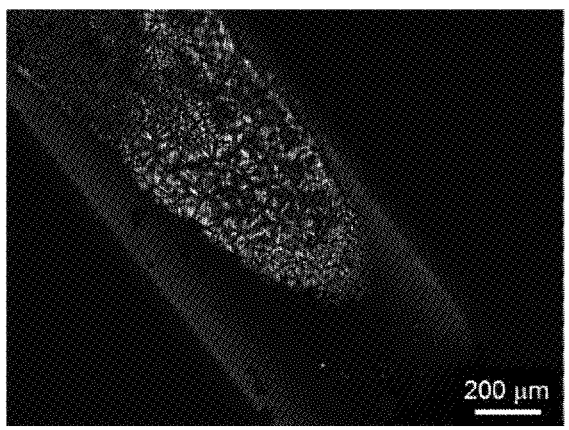
FIG. 23A denotes a polarizing microscope image of the boron liquid crystal at room temperature, and FIG. 23B denotes an enlarged image thereof.
Figure 23B:
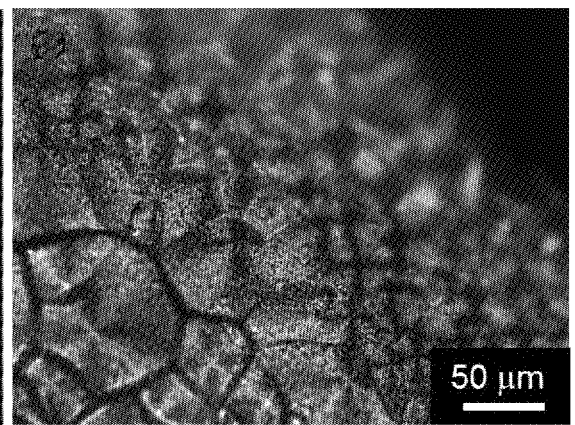

It has been suggested that the change from the liquid crystal phase I to II passes through a supercooled state in the cooling process of DSC. Thus, the cooling rate was altered from 10° C./min to 20° C./min, and the change of transition behavior from the liquid crystal phase I to II was observed with a polarizing microscope. As a result, in the case of 10° C./min, a transition from the liquid crystal phase I to II was seen at approximately 55° C.; however, in the case of 20° C./min, it was not until cooling up to room temperature that interference colors of the liquid crystal phase II began to emerge (FIG. 23A). As a result of high-magnification observation, liquid crystal domains of approximately several tens of micrometers, which are considerably smaller than in the case of 20° C./min, were observed. Further, it has been found that these liquid crystal domains have a liquid crystal texture called Schlieren texture, which has distinctive dark color portions that spread in a cross-like manner from centers along the polarization directions of the two polarizing plates (FIG. 23B). Also from such variations in the temperature of transition to the liquid crystal phase II and the size of the liquid crystal domain depending on the cooling rate, it has been shown that the phase transition from the liquid crystal phase I to II passes through a supercooled state.

Figure 24A:
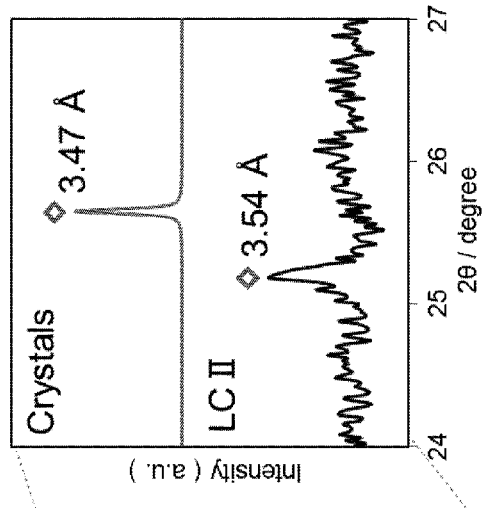
FIGS. 24A and 24B denote XRD patterns of the boron layered crystal (simulation) and the boron liquid crystal in liquid crystal phase II.
Figure 24B:
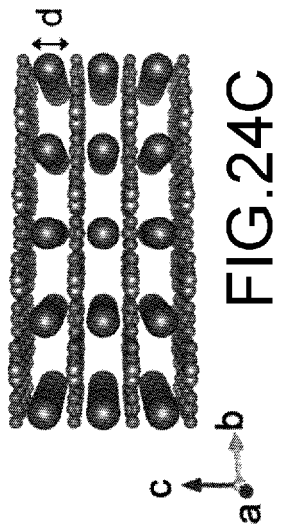
Figure 24C:
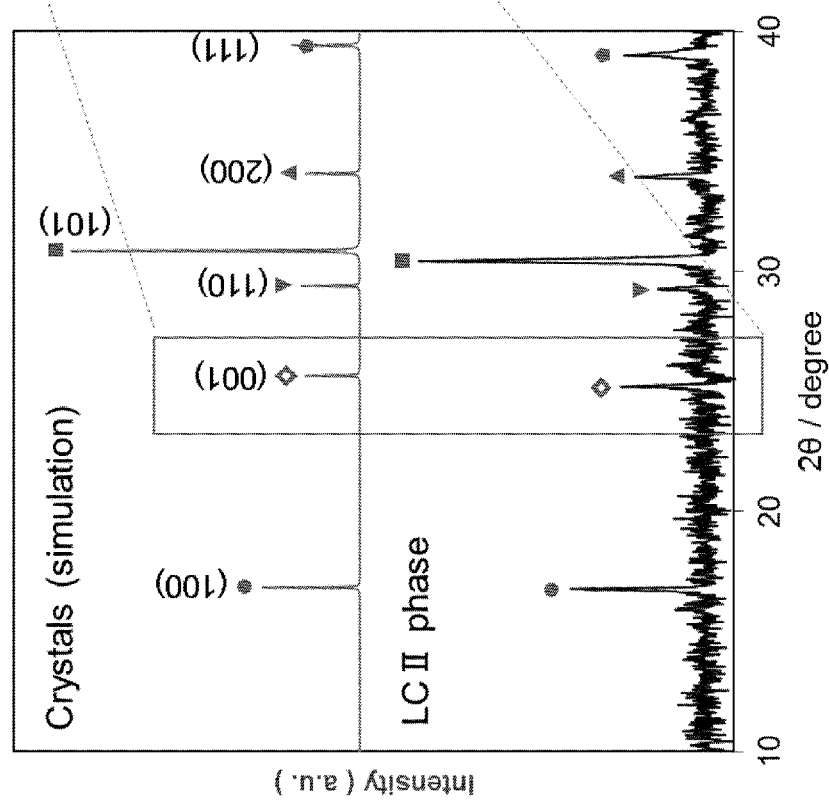
FIG. 24C shows a structure of a boron layered crystal.

A powder XRD measurement at room temperature of boron liquid crystals vacuum-sealed in a capillary was performed in order to elucidate the structure of the liquid crystal phase II. As a result, a diffraction pattern of (100), (110), and (200) coinciding with the pattern of the boron layered crystal was obtained, and it has been revealed that the liquid crystal phase II holds a boron sheet structure (FIGS. 24A to 24C)(FIG. 2II). On the other hand, it has been found that the peaks of (001), (101), and (111) including components in the c-axis direction, which is the stacking direction, are shifted to the low angle side. It has been found that the interplanar spacing of (001) indicating the interlayer spacing is 3.47 Å in the crystal state, whereas in the liquid crystal phase II it is 3.54 Å and has expanded by approximately 0.1 Å. From this fact, it has been found that the liquid crystal phase II is a state where, while the orientation order in the in-plane direction of the boron sheet is held, only the orientation order in the stacking direction is expanded. It is presumed that the fluidity of the liquid crystal has occurred from such expansion in the interlayer direction.

The decomposition behavior at more than or equal to 350° C. can be found also from TG. As a result of TG measurement in argon, a weight decrease of approximately 12% was seen from around 350° C. (FIGS. 25A to 25C). After the measurement, the boron layered crystal, which had been a white crystal before the measurement, had changed to black color, and had a shape like that obtained by being once melted and solidified again; thus, it has been suggested that the weight decrease at 350° C. is due to pyrolysis.

Figure 26A:
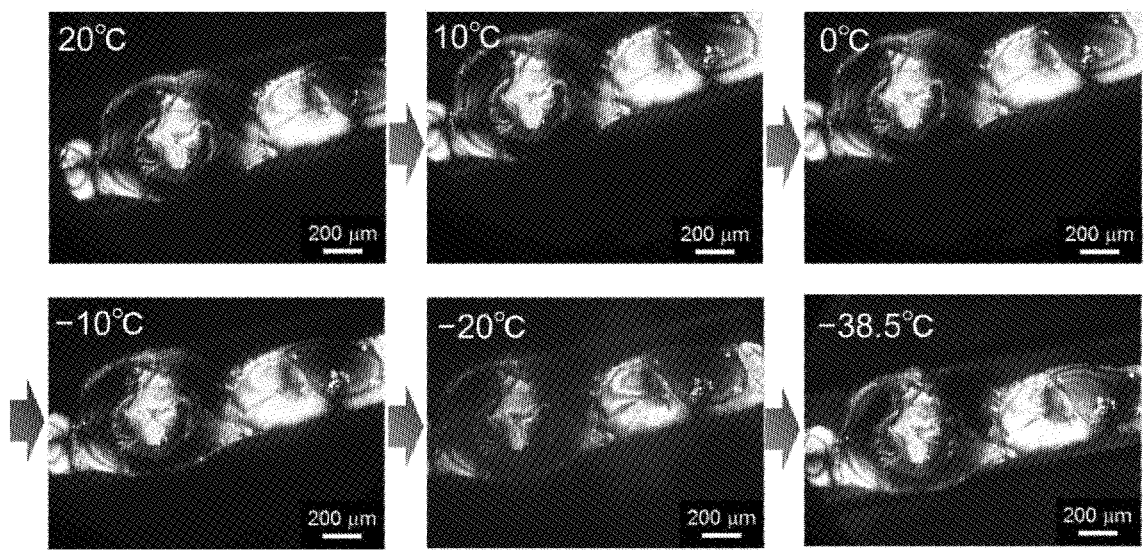
FIG. 26A denotes polarizing microscope images of the boron liquid crystal during a cooling process from 20° C. to −38.5° C., and FIG. 26B denotes DSC curves of the boron liquid crystal in argon conditions.

The stability in a low temperature region of the boron liquid crystal was evaluated by cooling the liquid crystal phase II under a polarizing microscope. Using a cooling apparatus, slow cooling at a rate of less than or equal to 5° C./min was performed in order to exclude the possibility of supercooling; and the inspection of the temperature at which a transition was made from the liquid crystal phase II to a crystal was attempted. When cooling was performed from 20° C., the liquid crystal texture was not changed even when cooling was performed up to −38.5° C., which is the apparatus limit temperature (FIG. 26A). From this fact, it has been found that the liquid crystal phase can be stably held up to at least approximately −40° C.

Figure 26B:
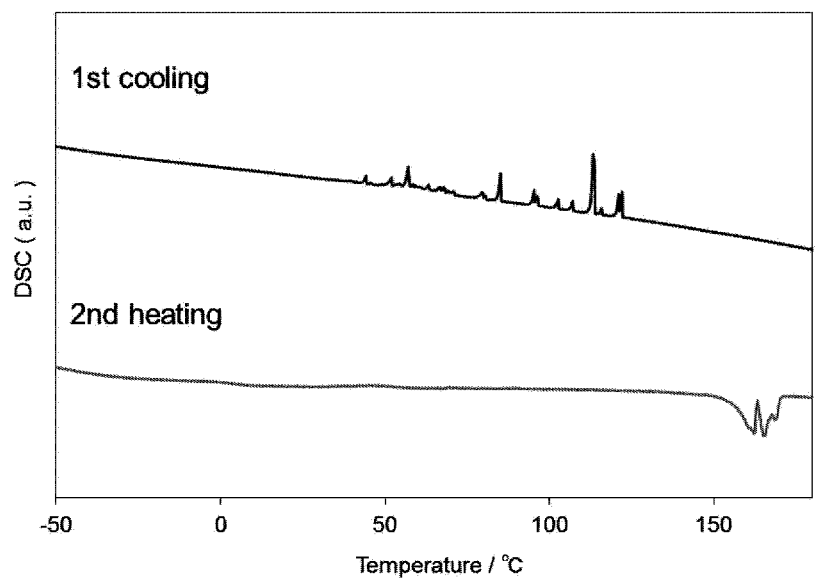

Further, when a cooling process up to −50° C. was inspected also by DSC measurement in argon, no peak was observed on the low temperature side except for the phase transition between the liquid crystal phases I and II (FIG. 26B). From this fact, it is presumed that the point of transition from the liquid crystal to a crystal is present more on the low temperature side than −50° C.

From the above, it has been found that the point of transition to a crystal cannot be observed by polarizing microscope observation using a cooling apparatus, because the boron liquid crystal is stable in the low temperature region. Thus, crystallization by immersing a boron liquid crystal in liquid nitrogen was attempted. A capillary containing the boron liquid crystal was immersed in liquid nitrogen for 1 minute and one night, but no change was seen in liquid crystal texture (FIGS. 27A to 27D). While there is a possibility that the boron liquid crystal will be very stable in a low temperature region, also the possibility of transition to a glass state by rapid cooling is conceived; at least transition to a crystal by cooling with liquid nitrogen was not observed.

Since the possibility that the liquid crystal phase II would be very stable in a low temperature region was conceived, direct crystallization of the liquid crystal phase I was attempted by performing rapid cooling from a state of the liquid crystal phase I without passing through the liquid crystal phase II. When rapid cooling was performed from a state of the liquid crystal phase I at 200° C. to room temperature, it has been found that a crystal phase in which textures like very sharp lines innumerably grew emerged immediately after the rapid cooling (FIGS. 27E to 27H). However, when the crystal was allowed to stand still at room temperature, an event where the sharp lines of the crystal phase began to gradually disappear and the textures were changed was observed. Then, it has been found that, 40 minutes after the rapid cooling, the crystal was completely changed to the liquid crystal phase II. Since a transition to a crystal phase was seen, it has been found that the boron liquid crystal can become also a crystal. Then, since the crystal was, after once changed to a crystal phase, gradually changed to the liquid crystal phase II, it can be seen that, at room temperature, the liquid crystal phase II is not a supercooled state. Thus, high stability of the liquid crystal phase II at room temperature has been proven.

3. Turning to Atomic Layers by Dissolution and Lyotropic Liquid Crystallinity 3-1. Inspection of solubility of boron layered crystal Unlike graphite or the like, which is stacked by van der Waals forces, the boron layered crystal is stacked by ionic interaction between the anionic boron sheet and potassium cations; thus, the dissolution of the boron sheet can be expected while the sheet structure is held as it is by dissolving out $K^+$ with a highly polar solvent.

Thus, the solubilities in various solvents of boron layered crystals were inspected. 10 µL of each solvent was cast on a boron crystal placed on a laboratory dish, and the process of dissolution was observed with an optical microscope. As a result, when solvents having solubility were cast, an event where rod-like crystals gradually became smaller and finally were completely dissolved and disappeared was found (FIGS. 28A and 28B). When the solubilities in nine kinds of solvents were inspected, it has been found that crystals were dissolved in protic solvents such as $H_2O$, methanol, and ethanol, and aprotic highly polar solvents such as DMF and DMSO.

An absorption spectrum of a solution in which the boron crystal was dissolved was measured in order to find the holding of a sheet structure after dissolution in the solvent. When an absorption spectrum in the near-infrared region of a DMF solution was measured, absorption agreeing with a spectrum obtained by solid diffuse reflection of the boron layered crystal was obtained. From this fact, it has been suggested that a boron sheet structure was held in the DMF solution even after dissolution.

3-2. Inspection of Lyotropic Liquid Crystallinity

The lyotropic liquid crystallinity of the boron layered crystal was inspected by completely dissolving the boron layered crystal in DMF on an HOPG substrate and using a polarizing microscope to observe a process in which the solvent volatilized. The exhibition of liquid crystallinity can be found by polarizing microscope observation. When the solution shows interference colors like on a crystal while having fluidity, the solution can be said to be in a liquid crystal state. As a result, the solution became a transparent solution immediately after the dissolution of the crystal, but the emergence of a hemispherical liquid crystal phase was observed during the process in which the solvent volatilized (FIGS. 29A to 29C). From this fact, it has been shown that, by dissolution in DMF, the boron layered crystal exhibits lyotropic liquid crystallinity similarly to current inorganic layered crystals.

It can be seen that, in this liquid crystal phase, interference colors are exhibited along a peripheral portion of a liquid drop and dark color portions appear in perpendicular cross-like directions along the directions of the two polarizing plates (FIGS. 29D to 29F). It is presumed that this is a liquid crystal phase derived from the orientation of the boron sheet. It has been found that, when this liquid crystal phase was further allowed to stand and the volatilization of DMF progressed, the interference colors in the peripheral portion of the liquid crystal gradually became weaker and finally a polycrystal was produced.

The shape observation of the residual crystal after DMF volatilization by SEM measurement was performed. Direct observation of a polycrystal observed with a polarizing microscope succeeded. As a result, a large amount of plate-like flakes each having approximately 20 nm were seen, and it has been found that the plate-like flakes were stacked to form a polycrystal (FIGS. 30A to 30D). When these flakes were partially enlarged, a layered structure in which sheets were stacked was observed; thus, it has been shown that the sheet did not decompose but held a sheet structure even after the boron layered crystal was dissolved in DMF.

3-3. Exfoliating of Atomic Layer by DMF Dissolution

Since DMF dissolution of the boron layered crystal was shown, the exfoliating of an atomic layer by utilizing this phenomenon was performed. The boron crystal was dissolved in DMF, and was cast on an HOPG substrate to attempt to apply the boron sheet to the substrate.

A DMF solution of the boron layered crystal was cast on an HOPG substrate, and AFM observation was performed. Since DMF has a high boiling point, measurement was performed after drying was performed in a vacuum for 1 week after casting. As a result of the AFM observation, the observation of a uniform atomic layer with a height of approximately 2 nm succeeded (FIGS. 31A and 31B). The thickness is larger than the thickness of the boron sheet predicted from the crystal structure (interlayer: 0.35 nm); it is presumed that this is due to the offset of the AFM and due to the adsorption of potassium ions and DMF on the layer surface.

The invention claimed is:

1. An atomic layer sheet comprising an atomic layer comprising boron and oxygen as framework elements, wherein the atomic layer sheet is networked by nonequilibrium couplings having boron-boron bonds, and has a molar ratio of oxygen to boron of less than 1.5, and wherein the atomic layer comprising boron and oxygen is anionic.

2. The atomic layer sheet according to claim 1, further comprising alkali metal ions, wherein a molar ratio of alkali metal ion to boron is less than 1.

3. The atomic layer sheet according to claim 1, wherein a composition of the framework is $B_5O_3$, the framework has three-fold symmetry having boron-boron bonds, the atomic layer sheet comprising:

a constituent X that serves as the framework; and a constituent Y other than the constituent X, wherein the constituent Y is a terminal part and/or a deficient part, and wherein the constituent Y is a boron oxide part containing B—OH.

4. The atomic layer sheet according to claim 3, wherein, in X-ray photoelectron spectrometry, the atomic layer sheet has a peak derived from a B-1s level at each of range of 190.5 to 193.0 eV, and 192.5 to 194.0 eV.

5. The atomic layer sheet according to claim 4, wherein, in the X-ray photoelectron spectrometry, the peak at a range of 190.5 to 193.0 eV corresponds to the constituent X.

6. The atomic layer sheet according to claim 3, wherein, in IR measurement, the atomic layer sheet has two kinds of peaks derived from B—O stretching at around 1300 to 1500 $cm^{-1}$, and further has a peak derived from BO—H stretching at around 3100 $cm^{-1}$.

7. The atomic layer sheet according to claim 6, wherein, in the IR measurement, a peak on a low wave number side out of the two kinds of peaks derived from B—O stretching corresponds to the constituent X.

8. A laminated sheet comprising:

a plurality of atomic layer sheets each according to claim 1; and metal ions between the plurality of atomic layer sheets.

9. The laminated sheet according to claim 8, wherein the metal ion is an alkali metal ion.

10. The laminated sheet according to claim 9, wherein a molar ratio of alkali metal ion to boron is less than 1.

11. A crystal comprising the laminated sheet according to claim 8.

12. A thermotropic liquid crystal comprising the atomic layer sheet according to claim 1.

13. The thermotropic liquid crystal according to claim 12 comprising a laminated sheet incorporating metal ions between a plurality of the atomic layer sheets.

14. The thermotropic liquid crystal according to claim 13, wherein the metal ion is an alkali metal ion, and the laminated sheet has a molar ratio of alkali metal ion to boron of less than 1.

15. The thermotropic liquid crystal according to claim 12, wherein a composition of the framework is $B_5O_3$, the framework has three-fold symmetry having boron-boron bonds, the atomic layer sheet comprising:

a constituent X that serves as the framework; and a constituent Y other than the constituent X,
wherein the constituent Y is a terminal part and/or a deficient part,
and wherein the constituent Y is a boron oxide part containing a $B_2O_3$ unit.

16. A lyotropic liquid crystal comprising the atomic layer sheet according to claim 1.

17. The lyotropic liquid crystal according to claim 16 comprising a laminated sheet incorporating metal ions between a plurality of the atomic layer sheets.

18. The lyotropic liquid crystal according to claim 16, wherein the metal ion is an alkali metal ion, and the laminated sheet has a molar ratio of alkali metal ion to boron of less than 1.

19. The lyotropic liquid crystal according to claim 16, wherein the atomic layer sheet has a composition of a framework of $B_5O_3$, the framework has three-fold symmetry having boron-boron bonds, the atomic layer sheet comprising:

a constituent X that serves as the framework; and
a constituent Y other than the constituent X,
wherein the constituent Y is a terminal part and/or a deficient part,
and wherein the constituent Y is a boron oxide part containing B—OH.

* * * * *